US011318637B2

(12) United States Patent
Cross et al.

(10) Patent No.: US 11,318,637 B2
(45) Date of Patent: May 3, 2022

(54) METHOD FOR STRUCTURING, PATTERNING, AND ACTUATING DEVICES USING TWO-DIMENSIONAL MATERIALS

(71) Applicant: THE PROVOST, FELLOWS, SCHOLARS AND OTHER MEMBERS OF BOARD OF TRINITY COLLEGE DUBLIN, Dublin (IE)

(72) Inventors: Graham Cross, Dublin (IE); James Annett, Dublin (IE)

(73) Assignee: THE PROVOST, FELLOWS, SCHOLARS AND OTHER MEMBERS OF BOARD OF TRINITY COLLEGE DUBLIN, Dublin (IE)

( * ) Notice: Subject to any disclaimer, the term of this patent is extended or adjusted under 35 U.S.C. 154(b) by 1002 days.

(21) Appl. No.: 15/587,638

(22) Filed: May 5, 2017

(65) Prior Publication Data
US 2017/0320234 A1    Nov. 9, 2017

(30) Foreign Application Priority Data

May 6, 2016    (EP) .................................... 16168640

(51) Int. Cl.
| B28B 11/08 | (2006.01) |
| B28B 1/14 | (2006.01) |
| B28B 3/02 | (2006.01) |
| B28B 11/12 | (2006.01) |
| G03F 7/00 | (2006.01) |

(52) U.S. Cl.
CPC ............ B28B 11/0863 (2013.01); B28B 1/14 (2013.01); B28B 3/02 (2013.01); B28B 11/12 (2013.01); G03F 7/0002 (2013.01)

(58) Field of Classification Search
None
See application file for complete search history.

(56) References Cited

U.S. PATENT DOCUMENTS

| 8,468,611 | B2* | 6/2013 | Riedo .................... B82Y 10/00 427/226 |
| 2007/0154354 | A1* | 7/2007 | Faris ...................... G01Q 70/16 850/60 |
| 2009/0274874 | A1* | 11/2009 | Li .......................... B82Y 10/00 428/156 |

(Continued)

OTHER PUBLICATIONS

Meng et al., "Mechanics of self folding of single layer graphene," J. Phys. D: Appl. Phys. 46 (2013) 055308 (6pp) (Year: 2013).*

(Continued)

*Primary Examiner* — Joseph S Del Sole
*Assistant Examiner* — Baileigh Kate Darnell
(74) *Attorney, Agent, or Firm* — Nixon Peabody LLP; David S. Resnick; Nicole D. Kling

(57) ABSTRACT

A method for patterning layers of 2D material by inducing self-assembly on a support substrate, the method comprising the steps of depositing a layer of 2D material on the support substrate; applying a force at a region consisting of a point, a line, or an a real region of the 2D material such that the 2D material forms a folded, self-contacting structure at that region.

20 Claims, 15 Drawing Sheets

(56) References Cited

U.S. PATENT DOCUMENTS

| | | | | |
|---|---|---|---|---|
| 2011/0023946 A1* | 2/2011 | Li | .................. | C07D 487/22 |
| | | | | 136/252 |
| 2011/0165329 A1* | 7/2011 | Mirkin | .................. | G03F 7/0002 |
| | | | | 427/256 |
| 2013/0040856 A1* | 2/2013 | Mirkin | .................. | B82Y 10/00 |
| | | | | 506/11 |
| 2016/0136877 A1* | 5/2016 | Rogers | .................. | B32B 27/283 |
| | | | | 428/174 |
| 2018/0016403 A1* | 1/2018 | Kim | .................. | C08J 3/28 |

OTHER PUBLICATIONS

Zhang et al., "Free Folding of Suspended Graphene Sheets by Random Mechanical Stimulation," PRL 104, 166805 (2010) (Year: 2010).*
Blees et al., "Graphene kirigami." Nature 524(7564):204-207 (2015).
Chen et al. "Graphene folding on flat substrates." Journal of Applied Physics 116(16):1643011-1643016 (2014).
Schniepp et al., "Bending properties of single functionalized graphene sheets probed by atomic force microscopy." ACS Nano 2(12):2577-2587 (2008).
Sen et al., "Tearing graphene sheets from adhesive substrates produces tapered nanoribbons." Small 6(10):1108-1116 (2010).

* cited by examiner

METHOD FOR STRUCTURING, PATTERNING, AND ACTUATING DEVICES USING TWO-DIMENSIONAL MATERIALS

CROSS-REFERENCE TO RELATED APPLICATIONS

This application claims benefit under 35 U.S.C. § 119(a) of Application No. EP16168640.7 filed May 6, 2016, the contents of which are incorporated herein by reference in their entirety.

FIELD OF THE INVENTION

The invention relates to a method for structuring, patterning and actuating devices using two-dimensional (2D) materials, including graphene, via directed self-assembly.

BACKGROUND TO THE INVENTION

Many of the intrinsic electronic, thermal, optical and mechanical properties of two dimensional materials such as graphene exceed, in isolation or combination, that of other materials. Thus, these materials have the potential to become higher performance versions of conventional bulk semiconductor materials currently used throughout the electronics and optoelectronics industries. In addition, their 2D sheet-like geometry in principle allows many of the wafer surface manufacturing techniques familiar to these industries to be brought to bear, thus allowing an easier path to adoption. However, the same problems that currently limit semiconductor wafer manufacturing, including the lack of efficient high resolution lithography beyond standard optical processing limits, preclude, for example, easy production of graphene ribbons with sufficiently small width to be semiconducting. Achieving the full potential of 2D materials currently requires expensive patterning techniques such as electron beam or ion beam lithography, or less mature techniques such as nanoimprint lithography.

Further, it has recently been established that 2D materials have exceptional mechanical properties. There currently exists no way to structure, arrange, place, actuate and/or use 2D materials as mechanically active or mechanically coupled components in devices such as microelectromechanical systems (MEMS) or nanoelectromechanical systems (NEMS).

It is an object of the present invention to overcome at least one of the above-mentioned problems.

SUMMARY OF THE INVENTION

The specification describes a method for structuring, patterning, and actuating two-dimensional (2D) materials, including graphene, via directed self-assembly. It allows patterning of said material using a configuration step that enables an immediate self-assembly process under the presence of suitable conditions. The process is simple, controllable, and scalable for production of electronic, optical, thermal, mechanical and other devices, and applicable to a variety of 2D material systems. It can operate in air at room temperature. By correctly configuring supported sheets of graphene, or other suitable 2D materials, spontaneous growth of folded-over ribbon structures is formed with the width prescribed by the size of a seeding fold and length prescribed by the time of growth. The process can operate in parallel at various locations in a 2D material sheet, and can form structures ranging from the nanometer scale to the macroscopic scale on a timescale less than one second.

In addition, the specification describes a means to incorporate the configuration step such that it requires a further external stimulation to initiate the self-assembly process. In this embodiment, the self-assembly process itself can become part of the operation of a 2D material device, including fuse-like sensors, actuators and material delivery systems.

The self-assembly process can be configured for activation by any process that forms a folded-over, self-contacting region of a 2D material sheet otherwise supported by or adhered to a substrate. This can be at pre-existing edges of the sheet or at perforations, punctures or cuts formed as part of the configuring process. One realization of this is a controlled indentation or imprint process or method. Any force may be used to fold over the 2D material to configure it for the self-assembly process. Such forces include a mechanical force, a friction force, a sound or ultrasound wave, a temperature pulse or thermal force, an electrical force, a magnetic force, an electromagnetic pulse, or a radiation force due to an impingement of particles including atoms, molecules, ions, electrons and photons and beams thereof. For example, when a mechanical force is being used, a hard pre-patterned indentation die is brought into contact with a 2D sheet resting on the support substrate. A mechanical force (P) is applied to the indentation die at the point where the indentation die makes contact with the 2D material (see FIG. 9(i)), while (optionally) simultaneously imposing a lateral rapid oscillating load parallel to the surface (T) of the 2D material (see FIG. 9(ii)). Beyond a critical stress for the 2D material, the 2D sheet ruptures (see FIG. 9(iii)), and through successive lateral oscillations the folded structures at the periphery of the contact are formed (see FIG. 9(iv-vi)). Once the folded structures are formed, the indentation die is removed from the interface allowing the folded structures to self-assemble into ribbons (see FIG. 9(vii)) or flaps or multiple-folded structures. The process or method is directed by the geometry of the indentation die and the lateral oscillations which can be tailored to set the direction and size of the folded over flaps, ribbons or multiple-folded structures. The process or method is scalable to arrays of many simultaneously operating indentation tips, actuated in unison or independently, which allows for large, wafer-scale arrays of horizontal ribbons (or flaps or multiple-folded structures) to be produced from a single indentation procedure.

In the specification, the term "configuration structure" should be understood to mean a folded, self-contacting region of the 2D material that leads to self-assembly.

In the specification, the term "ribbon" should be understood to mean the 2D material structure formed by self-assembly either spontaneously after a configuration structure is realized or following an external stimuli applied to the 2D material containing the configuration structure. The ribbon may comprise any shape, size as well as multi-folded structure.

In the specification, the term "2D material" should be understood to mean a sheet or sheets of layered materials as specified here that can be of any size or number of layers, and may include a mixed stack or heterostack of layers of different types of said materials.

In the specification, the term "mechanical force" should be understood to mean a force of any magnitude or direction and possibly varying in time brought about by an external agent including a contacting body.

In the specification, the term "an electrical force" should be understood to mean an electric field brought about by an external agent, possibly varying in time.

In the specification, the term "friction" or "frictional force" should be understood to mean a force arising from lateral motion of a contacting body, possibly varying in time.

In the specification, the term "sound wave" should be understood to mean acoustic energy wave brought about by an external agent, possibly varying in time.

In the specification, the term "electromagnetic pulse" should be understood to mean electromagnetic radiation applied over a brief duration by an external agent.

In the specification, the term "stimulus", "external stimulus" or "energy" should be understood to mean a source of energy resulting in a force on the 2D material brought about by deliberate introduction of an external agent or by a natural change in the ambient environment.

In the specification, the term "self-contacting region(s)" should be understood to mean a region of folded-over, 2D material forming a ribbon that results from the puncturing of the 2D material sheet. The folded-over piece of material is contacting itself at the edge of the puncture site, which then begins the self-propagating process to from the ribbon.

In the specification, the term "folded ribbons" should be understood to mean the folded-over flakes of 2D material.

In the specification, the term "multi-folded" or "multi-stacked" should be understood to mean multiple layers of 2D material folded over on itself or multiple layers of 2D material stacked upon each other.

According to the present invention there is provided, as set out in the appended claims, a method for structuring and patterning 2D materials, the method comprising the steps of:

Depositing a layer or layers of 2D material on the support substrate;

Applying a (horizontal and/or vertical) force at a region consisting of a point, a line, or an areal region of the 2D material such that the 2D material forms a folded, self-contacting configuration structure at that region;

Removing the force from the region to allow the folded structure to self-assemble into a new structure through a combination of autonomous peeling, tearing, sliding and/or further folding processes.

According to the present invention there is provided, as set out in the appended claims, a method for patterning layers of 2D material by inducing self-assembly on a support substrate, the method comprising the steps of: depositing a layer of 2D material on the support substrate; applying a force at a region consisting of a point, a line, or an areal region of the 2D material such that the 2D material forms a folded, self-contacting structure at that region.

In one embodiment, the method further comprises the step of removing the force from the region to allow the folded structure to spontaneously self-assemble into a new self-contacting structure.

In one embodiment, the method further comprises the step of removing the force from the region and applying an energy or stimulus to the layer of 2D material to initiate self-assembly of the 2D material into a new self-contacting structure.

Preferably, the energy is selected from global heating in, for example, a furnace, an oven; rapid thermal anneal system; by a hot plate; by local heating from, for example, a laser, a heating element brought into proximity of or integrated with the substrate, for example, a resistive heating element.

Preferably, the stimulus is selected from light, infrared light, ultra-violet light, x-rays, electromagnetic radiation, reactive gas environment, liquid chemical, pH change, pressure change, electric field, magnetic field, heat pulse, or force pulse.

In one embodiment, the folded structure self-assembles by peeling, healing, sliding, tearing, or folding, or a combination thereof. In one embodiment, the folded structure spontaneously self-assembles by peeling, healing, sliding, tearing, or folding, or a combination thereof.

In one embodiment, the method further comprises the step of cutting, perforating or puncturing the layer of 2D material prior to applying the force to the layer of 2D material.

In one embodiment, the force being applied to the 2D material is selected from a mechanical force, a friction force, a sound or ultrasound wave, a temperature pulse or thermal force, an electrical force, a magnetic force, an electromagnetic pulse, or a radiation force due to an impingement of particles including atoms, molecules, ions, electrons and photons and beams thereof.

In one embodiment, the force being applied to the 2D material is a mechanical contact force.

In one embodiment, the force being applied is a mechanical force, and wherein the mechanical force is applied by the tip of an indentation die or an imprint stamp contacting said layer of 2D material at the region. Preferably, the method further comprises the step of applying an oscillating displacement of the tip with respect to the 2D material and surface of the support substrate. Preferably, the step of applying the displacement oscillation to the tip is performed simultaneously with the step of applying an mechanical force to the tip of the indention die or imprint stamp causing it to indent the surface of the support substrate and fret, fold or wrinkle the 2D material sandwiched in the contact.

In one embodiment, the displacement oscillation travels in a linear, circular, figure-of-eight, random, or any other pattern of motion relative to 2D material and the support substrate. Preferably, the displacement oscillation is restricted to a plane parallel to the 2D material and support substrate.

In one embodiment, successive oscillations of the tip initiates formation of the folded, self-contacting structure at the contact region.

In one embodiment, the oscillations impose a frequency of between about 0.001 Hz to about 1 GHz on the tip. Preferably, the frequency is 100 Hz. Preferably, the displacement imposed on the tip provides an amplitude of movement of between 0.01 to 10000 nanometers. Ideally, the displacement imposed on the tip provides an amplitude of movement of 1 nanometre.

In one embodiment, the indentation die or imprint stamp comprises several or many tips arranged in a specific pattern or layout to provide for the simultaneous formation of an array of self-assembling folded structures. Preferably, the array of self-assembly folded structures form a negative tone lithography structure consisting of patterns of 2D material left on the supporting substrate and not rearranged by self-assembly processes. Preferably, the array of self-assembly folded structures form a positive tone lithography structure consisting of patterns of 2D material formed during rearrangement by self-assembly processes.

In one embodiment, the indentation die or imprint stamp is a pre-patterned tool made from a hard substance or coating including diamond, polycrystalline diamond, diamond-like-carbon, glassy carbon, silicon carbide, silicon nitride, silicon, tungsten, tungsten carbide, sapphire, quartz, nickel, or other hard metals, ceramics or materials.

In one embodiment, the force being applied is a mechanical force, and wherein the mechanical force is applied by the tip comprising an adhesive surface at its apex configured to initiate self-assembly of the folded structures when the indentation die or imprint stamp is removed from the point of contact. Preferably, the adhesive surface of at the apex of the tip is selected from PMMA, polystyrene, PDMS, h-PDMS, cured epoxy, cured resist, or other polymeric material.

In one embodiment, the method further comprises a step of drawing the applied force across the surface of the 2D material to form a folded, self-contacting structure in said 2D material.

In one embodiment, the method further comprises the step of applying energy or stimulus to the layer of 2D material on the support substrate upon removal of the force to initiate self-assembly of the 2D material structure. Preferably, the energy is selected from global heating in, for example, a furnace, an oven; rapid thermal anneal system; by a hot plate; by local heating from, for example, a laser, a heating element brought into proximity of or integrated with the substrate, for example, a resistive heating element. Ideally, the stimulus is selected from light, infrared light, ultra-violet light, x-rays, electromagnetic radiation, reactive gas environment, liquid chemical, pH change, pressure change, electric field, magnetic field, heat pulse, or force pulse.

In one embodiment, said self-assembled structures are grown in a substantially horizontal direction relative to the support substrate.

In one embodiment, the self-assembled structures are flaps, ribbons, or multi-folded and/or multi-stacked structures.

In one embodiment, the deposition of the 2D material on the support substrate is by mechanical exfoliation, liquid exfoliation, chemical vapour deposition (CVD), chemical growth, or by direct mechanical transfer such as polymer carrier or chemical transfer.

In one embodiment, the method is performed within an environment selected from ambient air, one or more gases, a vacuum, water, liquid or other fluids.

In one embodiment, said 2D material layer is sourced from three-dimensional layered materials selected from the group comprising transition metal dichalcogenide having the formula $MX_n$, or any other layered material such as graphite, transition metal oxides, boron nitride (BN), $Bi_2Te_3$, $Sb_2Te_3$, TiNCl, or any other inorganic layered compound. Preferably, when the 3-dimensional transition metal dichalcogenide has the formula $MX_n$, M may be selected from the group comprising Ti, Zr, Hf, V, Nb, Ta, Cr, Mn, Mo, W, Tc, Re, Ni, Pd, Pt, Fe and Ru; X may be selected from the group comprising O, S, Se, and Te; and $1 \leq n \leq 3$.

In one embodiment, the 2D material layer is graphene.

In one embodiment, the number of layers of the deposited 2D material ranges from 1 to 100.

In one embodiment, the number of layers of deposited graphene ranges from 1 to 4.

In one embodiment, the support substrate comprises silicon, silicon oxide, silicon carbide, semiconductor, diamond, diamond-like-carbon, glassy carbon, metal, alloy, composite, nano-composite, ceramic, ceramic composite, or polymer In one embodiment, two or more layers of 2D material are deposited on the support substrate.

In one embodiment, a heterostack of two or more layers of different 2D material are deposited on the support substrate.

In one embodiment, two or more identical or different layers of 2D material are deposited on the support substrate to form a uniform stack or heterostack of 2D material, which can self-assemble into a new self-contacting structure.

In one embodiment, there is provided a device comprising self-assembling layers of 2D material produced by the method described above.

In one embodiment, the device is selected from the group comprising electrodes, transparent electrodes, electronic wires, electronic interconnects, capacitors, inductors, transistors, memristors, electronic sensors, optoelectronic sensors, solar cells, light emitting diodes, thermoelectric devices, dielectrics, batteries, super-capacitors, nano-transistors, nano-capacitors, nano-light emitting diodes, nano-solar cells, fuses, alarms, chemical release systems, and optical shutters.

The 2D material is generally sourced from 3-dimensional (3D) material. Deposition of the 2D material on to a substrate is generally by mechanical exfoliation, liquid exfoliation, chemical vapour deposition (CVD), chemical growth, or by direct mechanical or chemical transfer. The 3D material sources include, for example, transition metal dichalcogenide having the formula $MX_n$, or any other layered material such as graphite, transition metal oxides, boron nitride (BN), $Bi_2Te_3$, $Sb_2Te_3$, TiNCl, or any other inorganic layered compound. When the 3D transition metal dichalcogenide has the formula $MX_n$, M may be selected from the group comprising Ti, Zr, Hf, V, Nb, Ta, Cr, Mn, Mo, W, Tc, Re, Ni, Pd, Pt, Fe and Ru; X may be selected from the group comprising O, S, Se, and Te; and $1 \leq n \leq 3$.

In another embodiment of the present invention, there is provided a device comprising self-assembling layers of 2D material produced by the method described above.

Preferably, the device is selected from the group comprising electrodes, transparent electrodes, capacitors, electronic interconnects, transistors, electronic sensors, optoelectronic sensors, solar cells, light emitting diodes, thermoelectric devices, dielectrics, batteries, super-capacitors, nano-transistors, nano-capacitors, nano-light emitting diodes, and nano-solar cells.

Preferably, the tip of the indentation die includes geometrical shapes such as Berkovich, Vickers, Knoop, cube corner, pyramidal, conical, spherical, flat punch or other tip-like geometries. Preferably, the indentation die is made of diamond, sapphire, silicon, silicon nitride, silicon carbide, tungsten, tungsten carbide, or other suitable hard materials capable of withstanding contact loads. In addition, the indentation tip can be configured to have an adhesive tip.

Preferably, the size of the indentation tip can range from the nanometer scale to the millimetre scale.

Preferably, the at least one indentation die can be arranged in an array. Preferably, the indentation tip can include imprint stamps, imprint rollers, and other die types covering areas up to meters-wide in scale.

Some of the advantages of the method described herein is that the assembly process occurs with high yield (currently >75% on sample set of 100 potential growth events) via mechanical indentation of 1, 2, 3, or 4-layer graphene (or other 2D materials) placed on silicon oxide substrates (or other suitable substrates). Multiple stacking events of ribbons growing over each other can simultaneously form from densely placed indentation dies. Self-assembly nucleation and formation rate increases with temperature, in-film stress, and potentially other environmental modifiers such as presence of a gas, gas mixture, vacuum, aqueous environments, or other liquid environments. Thus the process may be carried out in environments other than air such as a vacuum chamber, a controlled gas environment chamber, a fluidic chamber, or any other gaseous or liquid environment.

In the specification, the term "ambient air" should be understood to mean the regular atmosphere found at the surface of the earth.

In the specification, the term "gas" or "gas environment", in the context of the environment within which the method is allowed to proceed, should be understood to mean a location where the surroundings consist of gaseous matter of any composition or pressure.

In the specification, the term "vacuum" should be understood to mean any location, including the interior of containers or outer space, where there is an absence of matter: Gas, liquid, or solid.

In the specification, the term "liquid environment" should be understood to mean a location where the surroundings consist of matter in the liquid state of any composition or pressure.

In the specification, the term "other fluids" should be understood to mean water, acids, bases, solvents, ionic fluids, buffers, fluid mixtures, slurries, gels, and suspensions.

Scanning Raman spectroscopy and friction force microscopy analysis both indicate that the stacked ribbons are incommensurate with the foundation layer below and thus have low friction superlubricious contact which allows thermodynamic drivers to overcome the remaining energy barriers to self-formation.

An advantage of the method described herein is that it provides wafer-scale 2D material processing, for example graphene, for electronic and other devices. While the method directly forms doubled over, 2 n layer ribbon structures, it also leaves precise strip-shaped holes in 2D material sheets, for example, a graphene sheet. Both are potentially useful for self-assembled lithography, with the latter realizing a "negative-tone" process for defining ribbons in the original graphene layer. Critical dimension (CD) definition may be selected by the cutting process, ribbon growth time, or both. Through the use of mechanically robust nanoimprint style cutting stamps, e.g. from diamond, a scalable graphene nanofabrication technique may be realized for CVD coated wafers, etc. with the potential for rapid nanoscale patterning. The method also provides an efficient patterning and structuring of graphene and other 2D materials; the fabrication of sub-optical dimension interconnects (negative tone lithography).

All of these methods can be tuned to control the number, size, and direction of formation of ribbons. They can be performed in succession on the same sheet, or scaled into arrays of collectively or individually activated indentation dies on a stamp die or roll-to-roll die.

BRIEF DESCRIPTION OF THE DRAWINGS

The invention will be more clearly understood from the following description of an embodiment thereof, given by way of example only, with reference to the accompanying drawings, in which:—

FIG. 1(i)-1(ix) illustrate an example of room temperature, autonomous growth in air of three folded ribbons by directed self-assembly nucleated from a single diamond Berkovich indentation that configured bi-layer graphene (BLG) on a silicon oxide surface. Tapping mode height atomic force microscopy (AFM) image (FIG. 1(i)) recorded approximately 30 minutes after indentation, FIG. 1(ii) to 1(vii) record further appearances of growth to the final static state 36 days after indentation. The three final ribbons are labelled 1, 2, and 3, and the black scale bars indicate 1 □m length.

In FIG. 1(viii) and AFM zoom in (FIG. 1(ix)) demonstrate multiple self-assembly of ribbons from multiple nucleation sites in one single layer graphene flake deposited on a silicon oxide substrate.

FIGS. 2(i)-2(v) depict a schematic representation of the operation of the mechanism believed to be responsible for the self-assembly. In FIG. 2(i), an AFM image shows a tri-layer graphene sheet supported by a silicon oxide substrate configured by diamond tip indentation that leaves folded-over, self-contacting regions of the graphene at the periphery of the indentation puncture.

FIGS. 3(i) to 3(iv) illustrate an energy diagram of the rate-activated process that drives self-assembly.

FIGS. 4(i) to 4(iv) depict a schematic representation of the relationship between configuring the 2D material and the onset of self-assembly. In FIG. 4(i), a 2D material on a supporting substrate has been configured to nucleate self-assembly. In FIG. 4(ii), the conditions necessary for self-assembly, one of which is described for FIG. 2(i)-2(v), are not immediately met, and self-assembly proceeds only when an external stimulus is realized. Alternatively, as in FIG. 4(iii), the conditions for self-assembly are immediately met, and self-assembly proceeds spontaneously upon configuration.

FIGS. 5(i) to 5(vi) illustrate further AFM image data on forms and sizes of 2D material self-assembly that can be induced.

FIGS. 6(i) to 6(iii) present AFM image data on the ways in which the length of the self-assembled structures in 2D materials can be controlled.

FIGS. 7(i) and 7(ii) illustrate AFM image data on a way in which self-assembling 2D material structures interact with surrounding objects.

FIG. 8(i)-8(iii) presents AFM image data to show how self-assembling ribbons can grow over each other or fold back on top of themselves to form structures of 3 or more vertically stacked layers.

FIG. 9(i)-9(vii) depict a schematic representation of one method used to establish the configuration structure that nucleates self-assembly. FIG. 9(i) An indentation die or tip is brought into contact with the 2D sheet with loading normal to the surface (FIG. 9(ii)), while simultaneously imposing oscillations in a direction lateral to the surface; FIG. 9(iii): rupture of the 2D sheet; FIG. 9(iv)-9(v): successive lateral oscillation forming a folded structure at the periphery of the contact; FIG. 9(vi): removal of the imprint die from the interface allowing the ribbons to self-assemble (FIG. 9(vii)).

FIG. 10(i)-10(vi) depict a schematic representation of another method used to establish the configuration structure that nucleates self-assembly.

FIG. 12(i)-12(iii) depict a schematic representation of a method that uses any of the methods illustrated in FIGS. 3 to 5 above to realize parallel, simultaneous configuration for self-assembly.

FIG. 13(i)-13(iii) depict a schematic representation of a method that realizes self-assembly of a 2D material topological hetereostack.

FIG. 22(i)-22(ii) depict a schematic representation of a method that realizes a material-release type device.

FIG. 23(i)-23(ii) depict a schematic representation of a method that realizes actuation of a self-assembling ribbon to open a window for the passage of light or other electromagnetic radiation.

DETAILED DESCRIPTION OF THE DRAWINGS

Methods

It is demonstrated herein that 2D materials, such as graphene, can spontaneously undergo a self-assembly phenomenon through combinations of folding, peeling from the substrate, healing by reattaching to itself, sliding and fracture by self-tearing. The process is robust to environmental conditions, can be realized in a number of 2D systems, and forms repeatable, robust structures. The process is controllable by scalable nano-imprint techniques and potentially useful as a large area, high throughput self-assembly lithography to make masks, 2D transistors or as an actuation phenomena for nanomechancial devices, nano-electrical mechanical systems (NEMS) or micro-electrical systems (MEMS).

Operation environment can be anyone of the following: air, gas environment, vacuum, and liquid.

Methods to configure the self-assembly of 2D materials by altering the relative adhesion of the sheet to the substrate versus itself can be selected from heat, electric, magnetic, or electromagnetic field, either as a static field, time varying field, or pulse; light, electromagnetic radiation, photon flux; an impinging flux of atoms, ions, or molecules from a focused beam or broad fluence; a change in surrounding gas or liquid composition, pH change, chemical reaction due to introduction of reactive species including hydrogen, oxygen, fluorine, or other volatile chemical species, friction etc.; or any other reversible or irreversible alteration of the adhesion of the substrate relative to the sheet itself.

Methods of external stimulation (for example, via alteration of available free energy) which alters the available free energy to drive self-assembly are selected from heat energy supplied to the system, strain energy supplied to the system by applying stress to the sheet.

DISCUSSION

Graphene flakes were mechanically exfoliated by mechanical exfoliation (e.g. the Scotch® tape method (Novoselov, K. S., D. Jiang, F. Schedin, T. J. Booth, V. V. Khotkevich, S. V. Morozov, and A. K. Geim. 2005. "Two-Dimensional Atomic Crystals." Proceedings of the National Academy of Sciences of the United States of America 102 (30): 10451-53) and deposited on Si wafers with 300 nm+/−5 nm oxide. The thinnest flakes were selected by optical microscopy and mounted in a nano-indentation system. Identical constant strain rate indentations were performed on the graphene flakes while imposing a small amplitude (1 nm), rapid (75 Hz) lateral oscillation of the tip during the entire indentation process. The residual impressions were monitored by atomic force microscopy using standard tapping mode silicon probes. The thicknesses of the graphene flakes and the stacking order of the folded ribbons (FR's) were determined via Raman spectroscopy.

Figure 1:
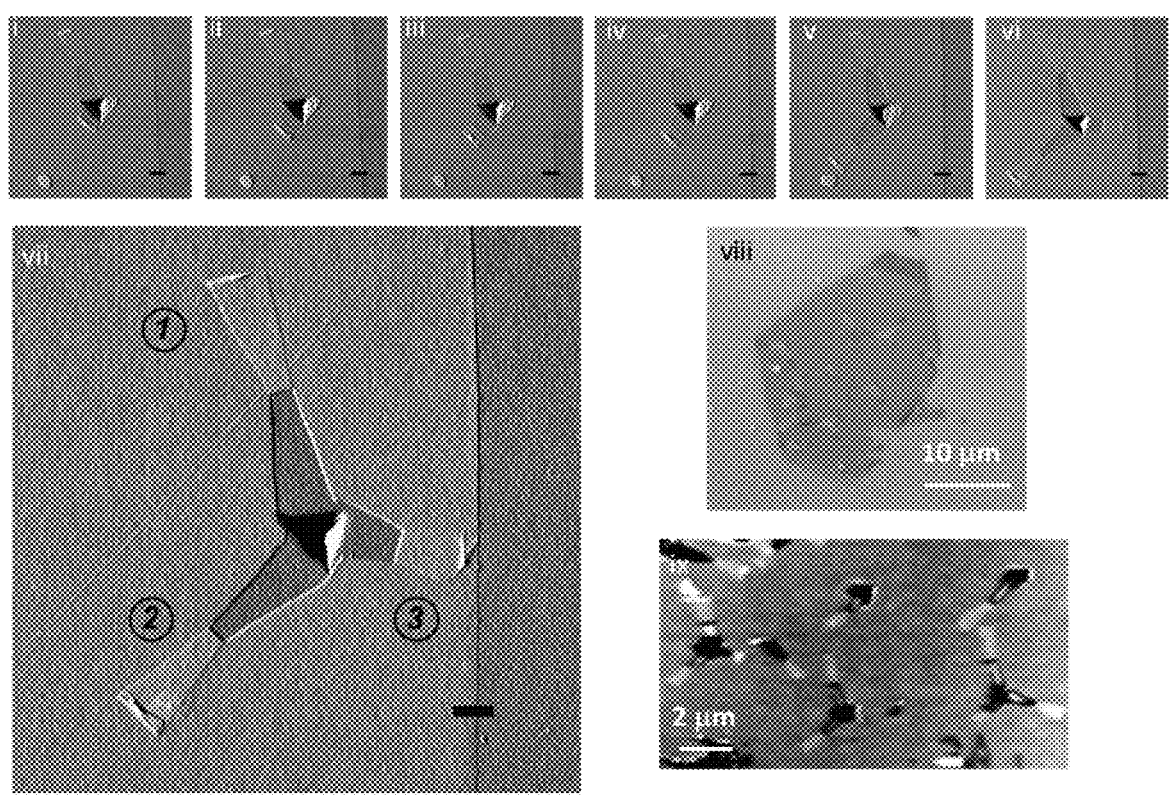

The self-assembly phenomenon in its basic form is summarized as follows (see FIG. 1), with graphene as the 2D material: a single diamond Berkovich indentation pierces a bilayer graphene (BLG) sheet deposited on a silicon oxide substrate, leaving a triangular pyramidal indent (black triangle) decorated by folded-over perforation remnants at its perimeter. Over time the folded-over graphene spontaneously glides out in a radial fashion away from the indent as shown in the time-lapse sequence of FIG. 1. It should be understood that a single (i.e. one) layer, two layers, three layers, four layers, five layers, and more, of graphene can be used. The self-assembly was nucleated by a single indentation into the bi-layer/SiOx surface, which punctured the graphene lattice and produced folded over structures along the facets of the triangular impression. The initial AFM image (FIG. 1(i)) was recorded approximately 30 minutes after the indentation. Two converging fracture paths along the graphene lattice can be seen on the upper side of the impression which is the result of the removal of a graphene ribbon-like structure from the SiOx surface. The room temperature growth of the ribbons in the upper and lower left hand side of the impression can be seen in FIG. 1(ii), which occurred over 4 days. However, the formation of a third folded ribbon can be seen in the lower right hand side of the impression by the nucleation of a second fracture path along the graphene lattice. The slow growth rates suggest that the self-assembly of the folded ribbons is a thermally activated process. The final static states of the ribbons is shown by the AFM image in FIG. 1(vii). No clear visible reason for the stopping can be seen in the ribbons on the upper or lower left hand side of the impression, however the ribbon on the lower right hand side ceased to grow beyond the edge of the flake which indicates sensitivity to the surface interactions between the graphene and the SiOx substrate. FIG. 1(viii) shows an optical micrograph of a bilayer graphene sample supported on a silicon oxide substrate where multiple ribbons have been nucleated. A zoomed image of a region of this sample is shown in the AFM image of FIG. 1(ix).

Figure 2:
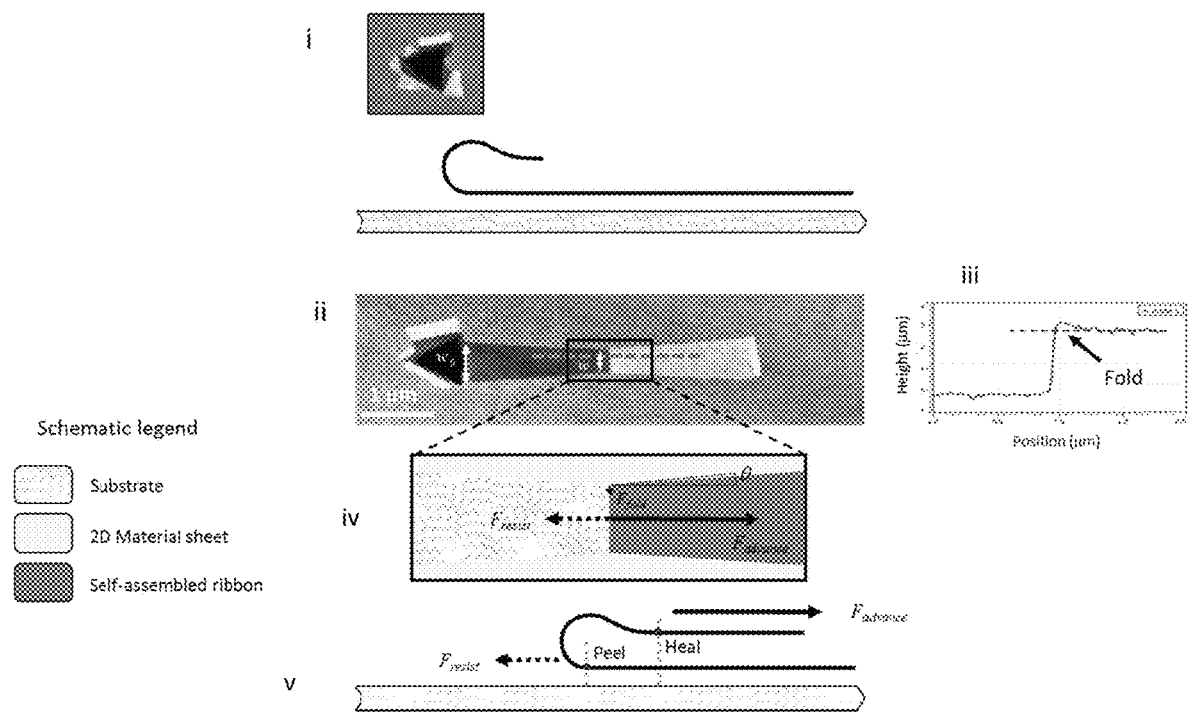
In FIG. 2(ii), an AFM image shows self-assembly by growth of a single ribbon from the folded-over configuration of FIG. 2(i). A height profile from this AFM image taken across the attaching fold (dashed line in image) is shown to the right in FIG. 2(iii). A schematic plan view zoom-in of the fold region is shown in FIG. 2(iv), with a cross-section of this schematic shown in FIG. 2(v). Thermodynamic forces on the ribbon structure are indicated as $F_{advance}$ and $F_{resist}$. The small, inward tapering is due to a force $F_{fold}$.

Turning now to FIG. 2, there is illustrated a schematic representation of the operation of the mechanism believed to be responsible for the self-assembly. In FIG. 2(i), an AFM image shows a tri-layer graphene sheet supported by a silicon oxide substrate configured by diamond tip indentation that leaves folded-over, self-contacting regions of the graphene at the periphery of the indentation puncture. A schematic cut-away view of one of these folded-over configurations is shown below. In (ii), an AFM image shows self-assembly by growth of a single ribbon from the folded-over configuration of (i). From a starting width $w_0$ of 800 nm, a ~3 $\mu$m long ribbon has spontaneously self-assembled by peeling from the silicon oxide substrate, forming two symmetric tears in the sheet, and sliding across the host graphene sheet, with a slight inward taper to narrow to a final width of about 400 nm. A height profile from this AFM image taken across the attaching fold (dashed line in image) is shown to the right in (iii). A schematic plan view zoom-in of the fold region is shown in (iv), with a cross-section of this schematic shown in (v). The autonomous peeling, tearing, and sliding that results in the formation of ribbon structures is believed to operate under the forces indicated in the schematic. Due to adhesion, the establishment of the configuring formation of (i) places thermodynamic forces on the ribbon structure indicated as $F_{advance}$ and $F_{resist}$. Under conditions that the adhesive affinity of the 2D material sheet to itself is greater than to the substrate it is supported by, $F_{advance} > F_{resist}$. Provided sufficient free energy (provided by heat or chemical potential) exists, ribbon self-assembly ensues as the sheet peels from the substrate, moves through the fold, and heals to itself, as a system approaching equilibrium. The small, inward tapering is due to a force $F_{fold}$ derived from a secondary energy minimization condition of reducing elastic strain energy in the fold. Under conditions where insufficient free energy exists, self-assembly can be induced at a later time through an external stimulus that provides the necessary free energy such as by heating. Further, under conditions where $F_{advance} < F_{resist}$, self-assembly can be induced at a later time by providing an external stimulus that reverses this inequality. In addition it is noted that the condition for self-assembly to cease are prescribed by the inequality $F_{advance} < F_{resist}$. This condition can be arrived at either autonomously as the forces on the structure evolve with its changing shape, or by the imposition of an external impediment such as a barrier, sheet edge, or other constraining agent. In the case of inward tapering ribbons, as shown in FIGS. 1 and 2, $F_{advance}$ is proportional to the shrinking width w of the fold attaching the ribbon to its host sheet, while $F_{resist}$ is not directly proportional to w, and thus self-assembly ceases when $F_{advance}$ becomes too small due to tapering.

Figure 3:
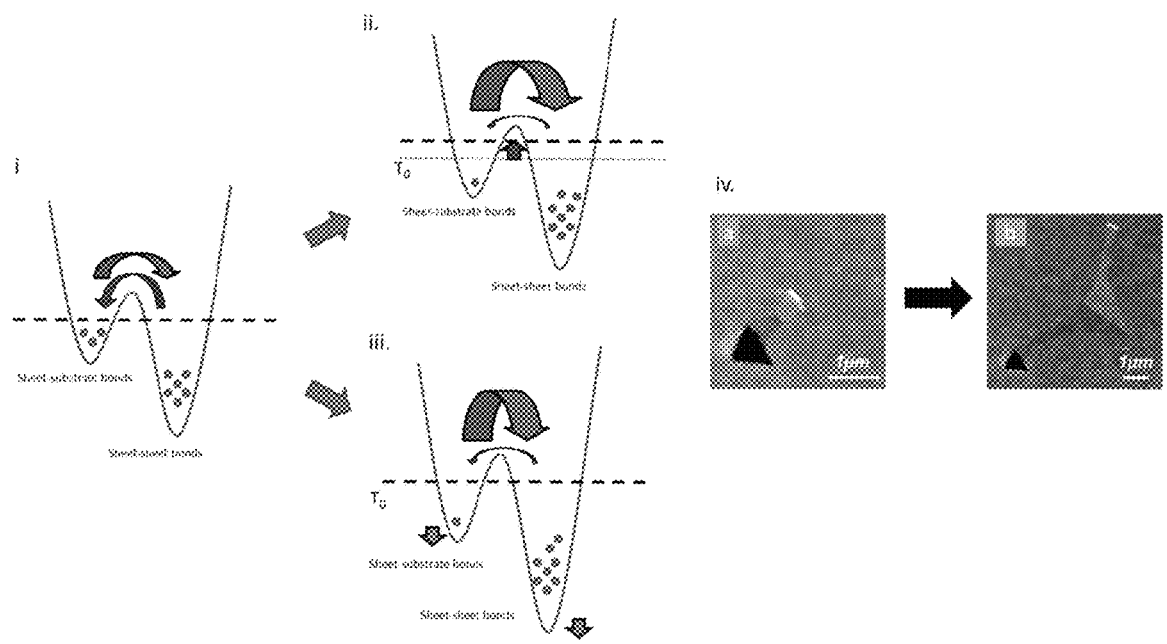

In FIG. 3(i) to (iv), there is illustrated an energy diagram of the rate-activated process that drives self-assembly. In (i), the population of two type of adhesive bonds (sheet-substrate vs. sheet-sheet, represented by small circles) is distributed between two potential energy minima separated by an activation barrier. The population distribution is set by thermodynamic equilibrium at temperature $T_0$ and the adhesion energies set by the depth of the two minima: Balance of number of processes going from one minima to the other is achieved when the probability of transfer either way, as given by the barrier height and population that can attempt, is the same. In (ii), an external perturbation consisting of the addition of free energy to the system, for example, by heating to a higher temperature, changes the relative equilibrium population which is realized by a force that advances the ribbon. In (iii), a similar outcome is realized by an external stimuli that changes the adhesion energy minima, again resulting in a force to advance the ribbon. FIG. 3(iv) provides an experimental example of the effect of external stimuli, where in (a) an AFM image shows a stationary graphene ribbon on silicon oxide substrate at equilibrium at room temperature which is then is subject to 150° C. heating by a hot plate, which causes the ribbon to advance to a new equilibrium position (b).

Figure 4:
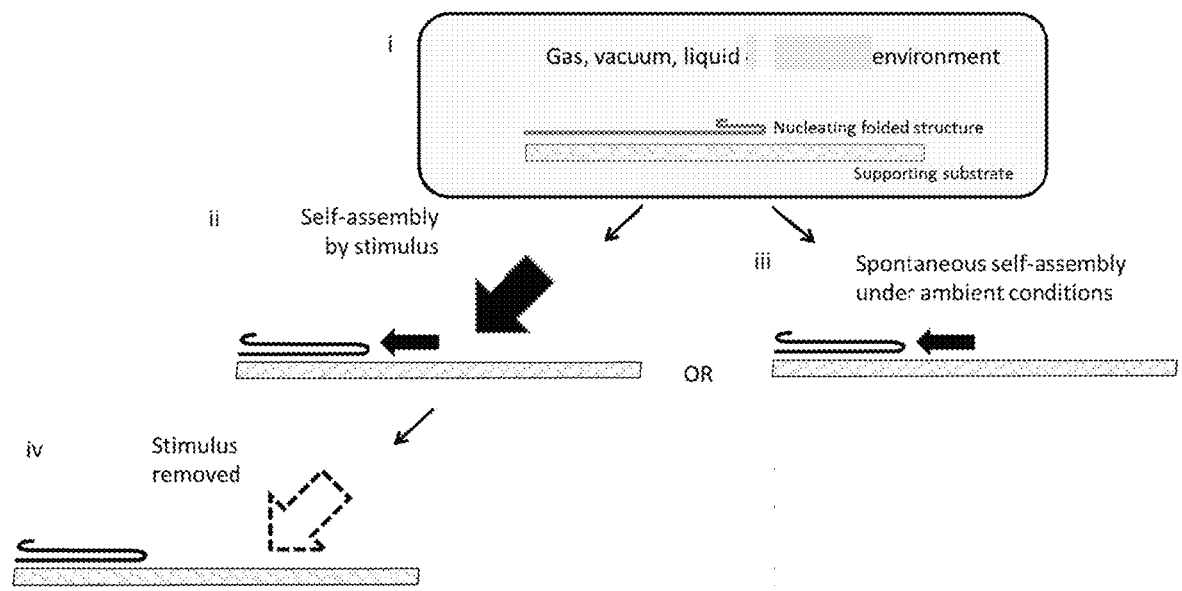

FIG. 4 is a schematic representation of the relationship between configuring the 2D material and the onset of self-assembly. In (i), a 2D material on a supporting substrate has been configured to nucleate self-assembly, potentially by the methods described in the subsequent three figures. In (ii), the conditions necessary for self-assembly, one which is described for FIG. 2, are not immediately met, and self-assembly proceeds only when an external stimulus is realized. Alternatively, as in (iii), the conditions for self-assembly are immediately met, and self-assembly proceeds spontaneously upon configuration. As an extension to case (ii), should the external stimulus either be removed, altered or become insufficient to sustain self-assembly, it will cease as in (iv) to leave a static structure.

Figure 5:
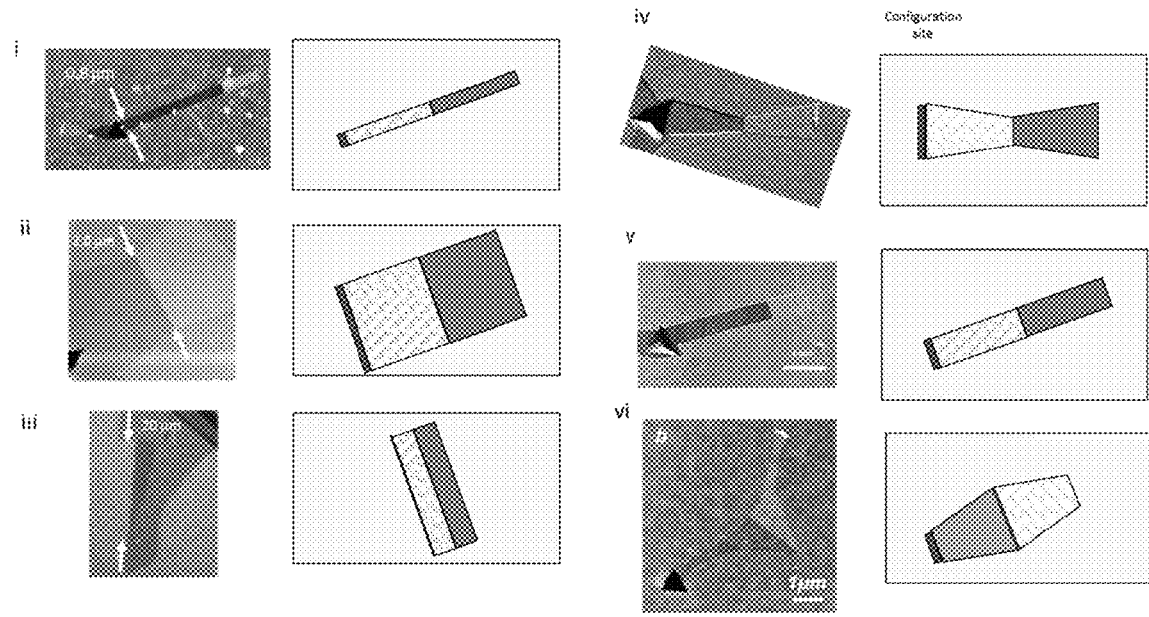

FIG. 5 presents further AFM image data on forms and sizes of 2D material self-assembly that can be induced. In (i), a 0.8 $\mu$m ribbon structure much longer than it is wide is produced, in (ii) a balanced aspect ratio 2.0 $\mu$m tab is produced with width as wide as length, and in (iii) a 20 $\mu$m strip much wider than its length is produced. In the AFM images of (iv) to (vi), different forms of tapering are shown as defined by the tearing process during self-assembly: (iv) shows inward tapering, (v) shows no tapering, and (vi) shows outward tapering.

Figure 6:
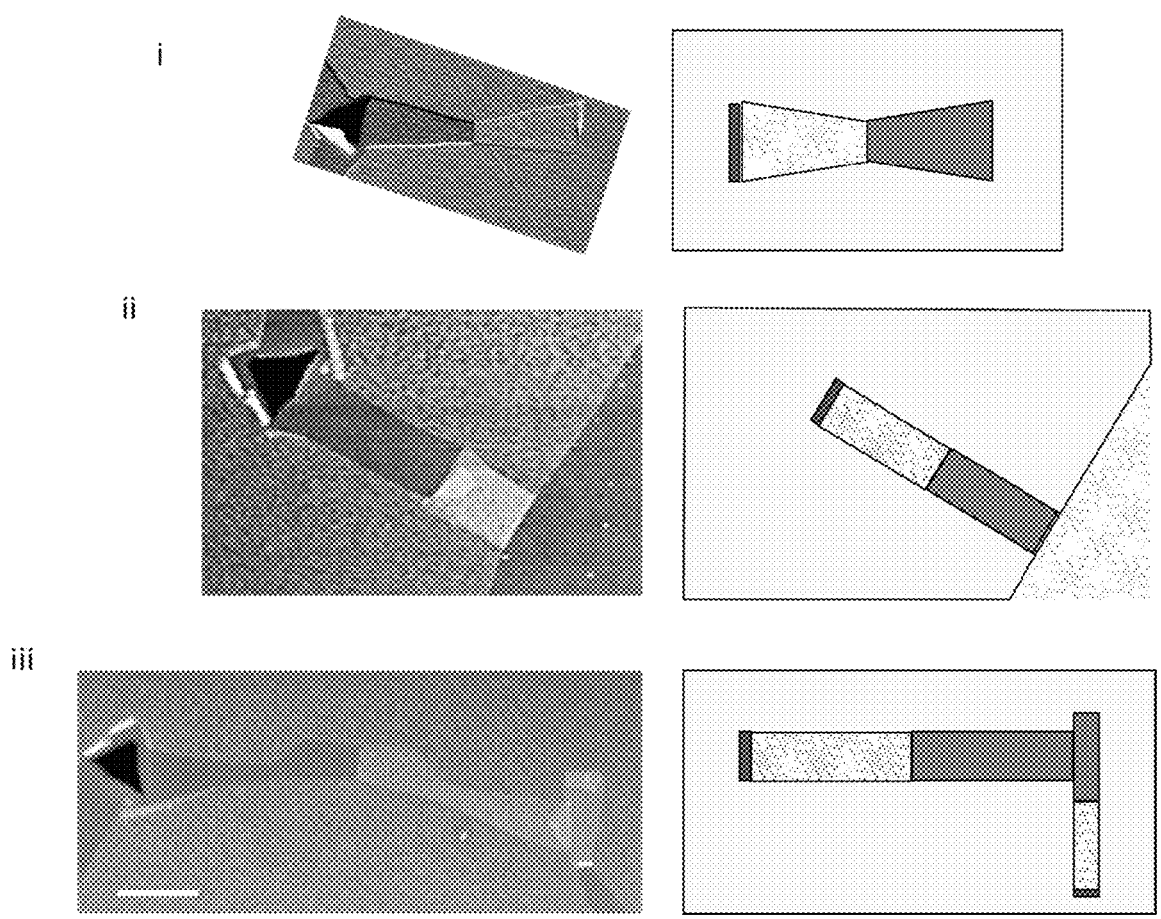

In FIG. 6 there is presented AFM image data on the ways in which the length of the self-assembled structures in 2D materials can be controlled. In (i), inward tapering in graphene leads to a reduced $F_{advance}$ as in FIG. 2, and stoppage of ribbon growth. In (ii) the ribbon encounters the edge of its host graphene sheet and stops growing, while in (iii) a ribbon in graphene growing to the right collides with another ribbon growing upwards and stops.

Another example of an alternative folded structure produced by indentation is shown in FIG. 6(ii). The twice folded ribbon continued to grow up to the edge of the flake which demonstrates the affinity of the graphene/graphene interaction. The final AFM image in FIG. 6(iii) is of a bi-layer folded ribbon which grew towards and collided with another folded ribbon causing the second, smaller FR to rotate. In addition, the image also shows a sudden change in direction of the fracture of the large FR which occurred during the thermal treatment. The examples shown in FIG. 6 illustrate the sensitivity of the self-assembly process to external conditions such as thermal treatment and various states of stress within the crack front which may provide a route for controlling the edge structure in fabricated graphene.

Figure 7:
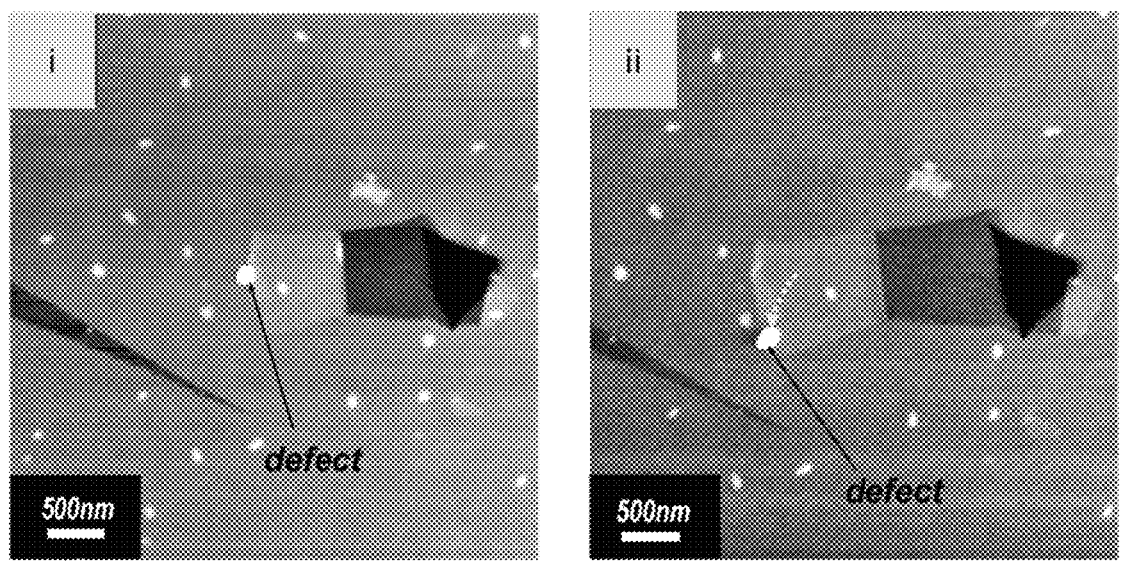

FIG. 7(i)-(ii) illustrate AFM image data on a way in which self-assembling 2D material structures interact with surrounding objects. In (i), a leftward advancing ribbon of bilayer graphene encounters a particle (or "defect") on the host sheet. The growth rate of the leftward advancing ribbon is reduced but not stopped, and continues by pushing the particle to the left and downwards as it advances, as shown in (ii). This demonstrates the ability self-assembling ribbons to perform work on external bodies.

FIG. 8(i)-(iii) are AFM image data illustrating how self-assembling ribbons can grow over each other, or fold back on top of themselves, to form structures of 3 or more vertically stacked layers. In (i), self-assembly has been induced near an edge of supported bi-layer graphene, such that the ribbon has impinged obliquely to the graphene edge and has stacked itself into three main layers connected by two folds. In (ii) a sequence of the steps is shown for the formation of the multi-stacked structure. The AFM image in (iii) shows the collision of multi-nucleated ribbons that either stop growth (right most ribbon) or lead to over/under stacking with the middle ribbon growing overtop the left most ribbon.

Figure 9:
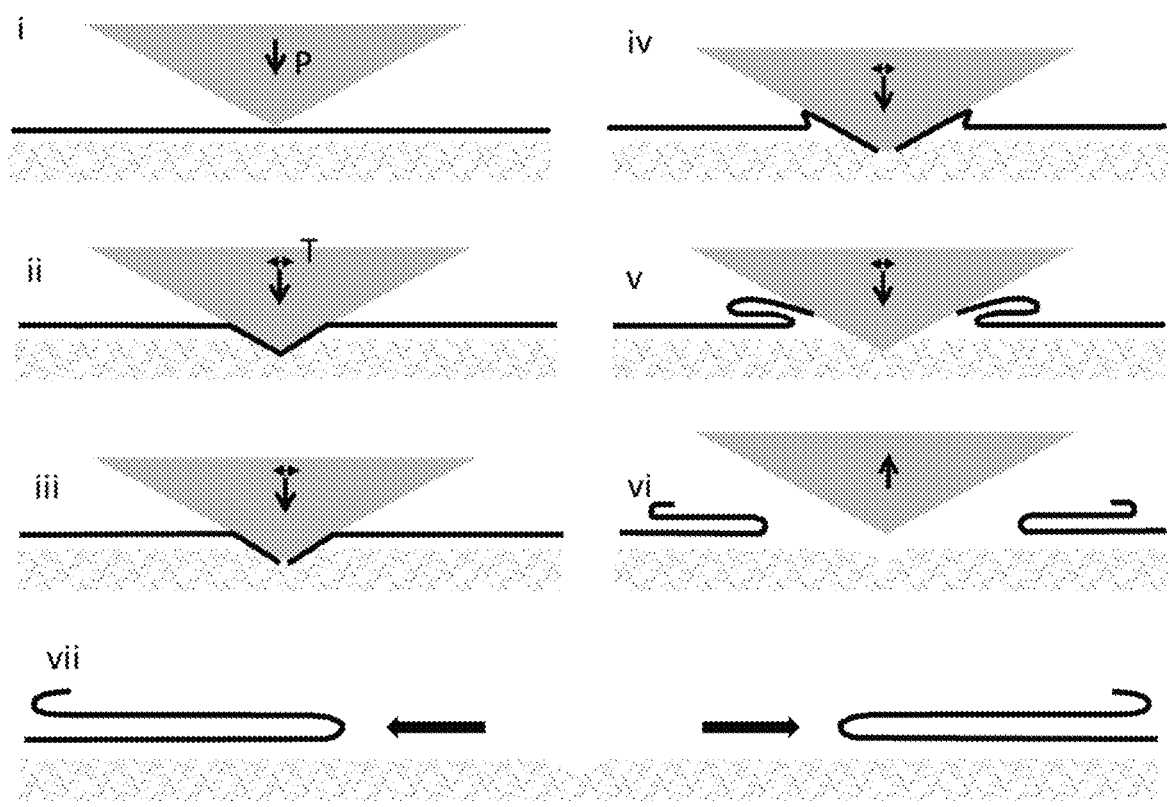

The self-assembly procedure can be configured by a controlled indentation process. FIG. 9(i) to (vii) is a schematic representation of one method used to establish the configuration structure that nucleates self-assembly. The pre-patterned indentation die is brought into contact with a 2D sheet of material resting on the support substrate. A mechanical force (P) is applied (FIG. 9(i)) at the point where the indentation die makes contact with the 2D material, while simultaneously imposing a rapid, lateral, oscillating load in the direction parallel to the surface (T) (FIG. 9(ii)). Beyond the critical stress, the 2D sheets ruptures, FIG. 9(iii), and through successive oscillations the folded structures at the periphery of the contact are formed (FIG. 9(iv, v)). Once the folded structures are formed the indentation die is removed from the interface allowing the folded structures to self-assemble into horizontal ribbons (FIG. 9(vi, vii)). The process is directed by the indentation geometry and the lateral oscillations which can be tailored to set the direction and size of the nucleating ribbon (or flap or multiple-folded structures). The process is scalable which allows for large, wafer-scale arrays of horizontal ribbons to be produced from a single imprint procedure.

Figure 10:
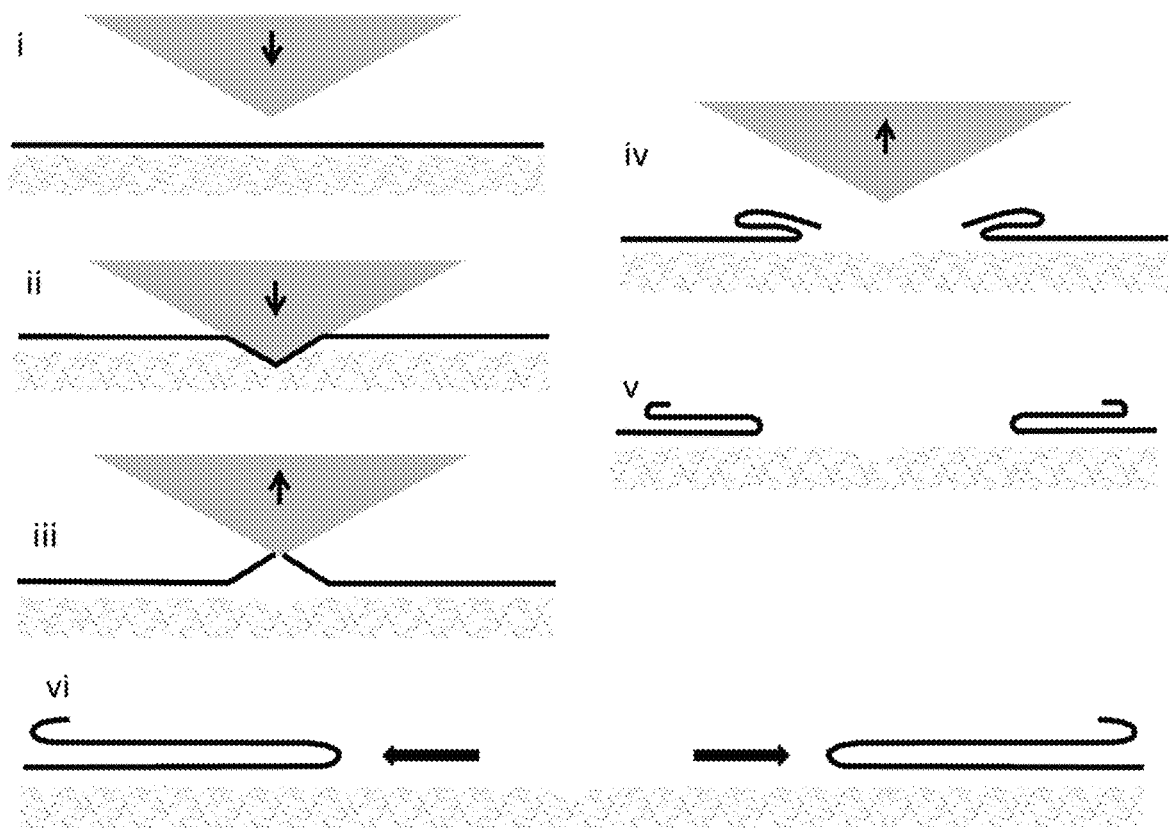

FIG. 10 is a schematic representation of a method used to establish the configuration structure that nucleates self-assembly. (i) An adhesive die or tip is brought into contact with the 2D sheet with loading normal to the surface (ii), and then withdrawn (iii) to rupture the 2D sheet forming a folded structure at the periphery of the contact (iv); (v) removal of the imprint die from the interface allowing the ribbons to self-assemble (vi).

Figure 11:
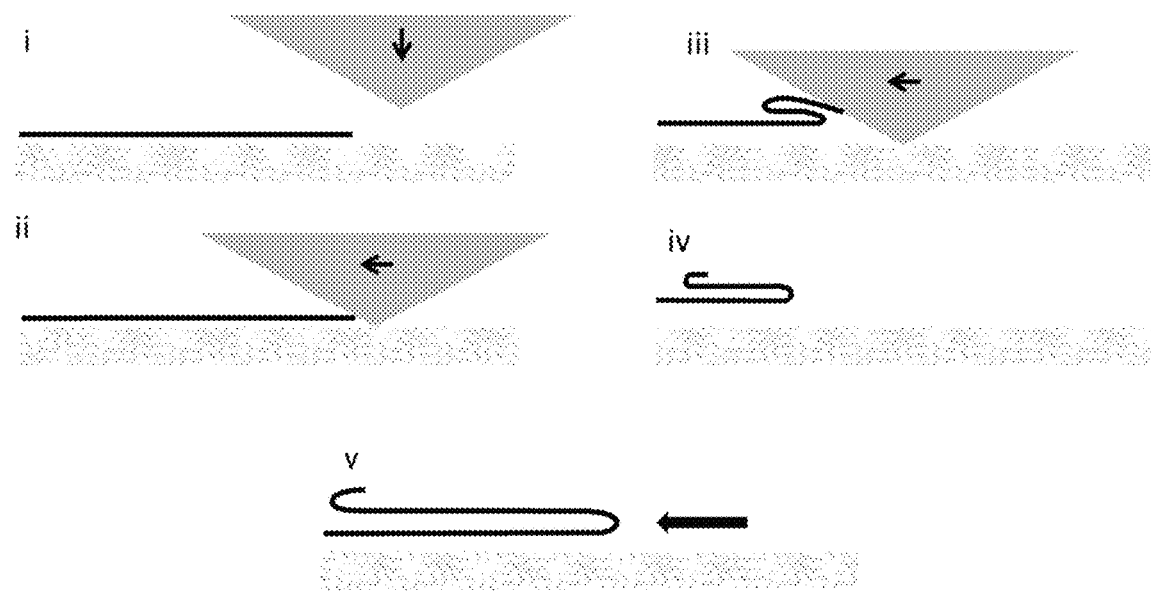
FIGS. 11(i)-11(v) depict a schematic representation of another method used to establish the configuration structure that nucleates self-assembly.

FIG. 11 is a schematic representation of a method used to establish the configuration structure that nucleates self-assembly. A die or tip is brought into the vicinity of the an edge of the 2D sheet (i), potentially making contact with the supporting surface (ii); the die or tip is then drawn, scratched or scraped along the surface (iii) towards the edge of the 2D sheet in order to crumple, fold, or otherwise move the 2D sheet, forming a configuring folded structure at the periphery of the contact (iv); and (v) removal of the imprint die from the interface allowing the ribbons to self-assemble.

Figure 12:
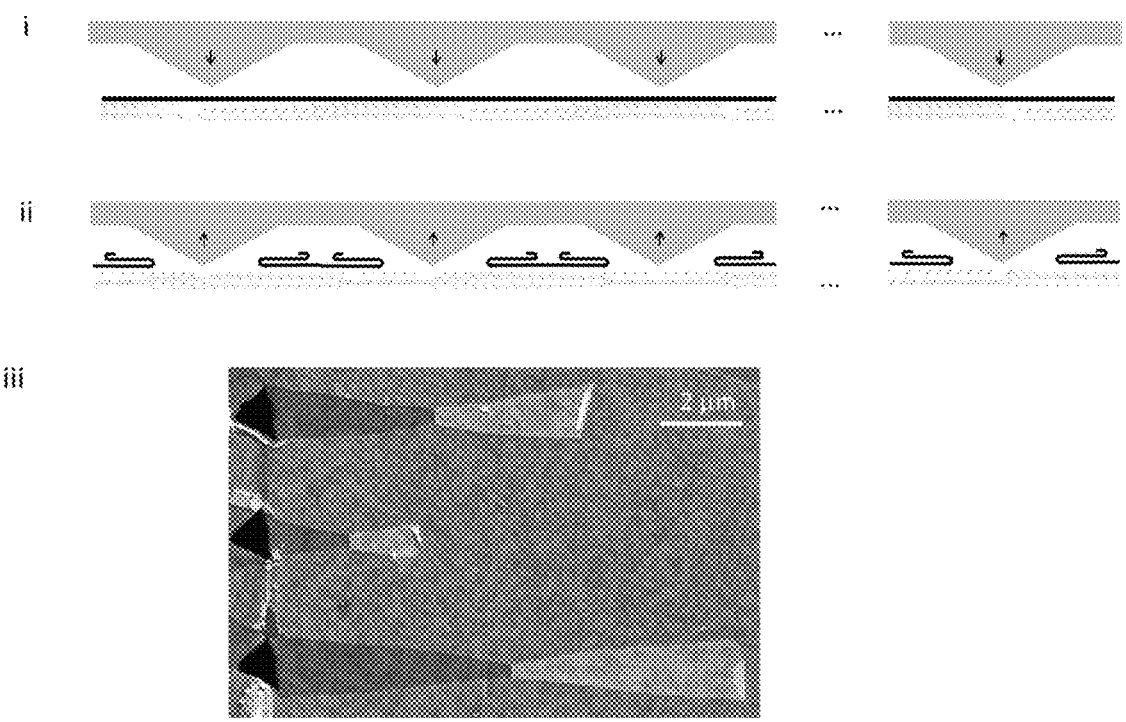

FIG. 12 is a schematic representation of a method that uses any of the methods illustrated in FIGS. 3 to 5 to realize parallel, simultaneous configuration for self-assembly. A die consisting of an array of tips is engaged with the 2D material supported by a substrate (i); following engagement of any of the methods of FIGS. 3 to 5 and removal of the imprint die from the surface, multiple configuration sites are left (ii) that allow ribbons to self-assemble simultaneously across the 2D material. In (iii) an AFM image of three ribbons formed in parallel in bilayer graphene is shown.

Figure 13:
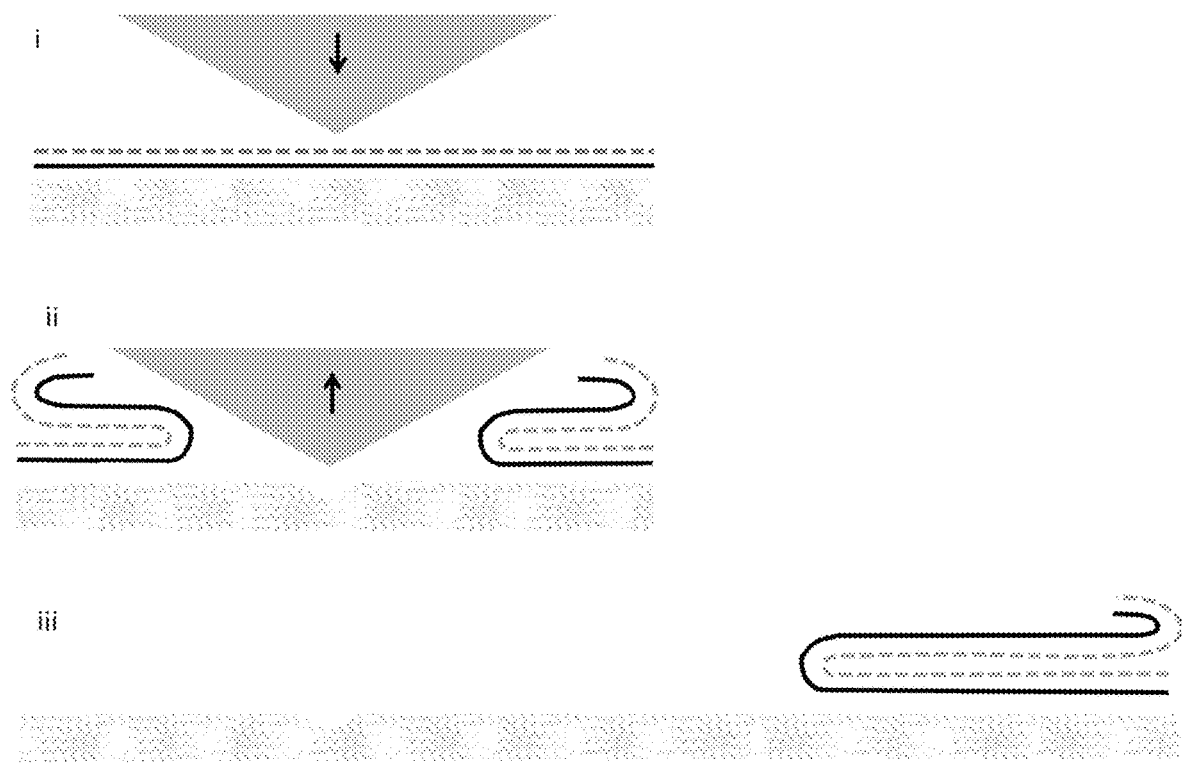

FIG. 13 is a schematic representation of a method that realizes self-assembly of a 2D material topological heterostack. In (i) a topological heterostack of two species of 2D material is supported by a substrate and approached by a die. The 2D materials could be of any type and layer number, and lie at any in-plane orientation to each other with respect to their crystallography (e.g. commensurate or incommensurate). (ii) The topological heterostack is configured for self-assembly by any of the methods described previously, to induce self-assembly of the entire stack (iii).

Figure 14:
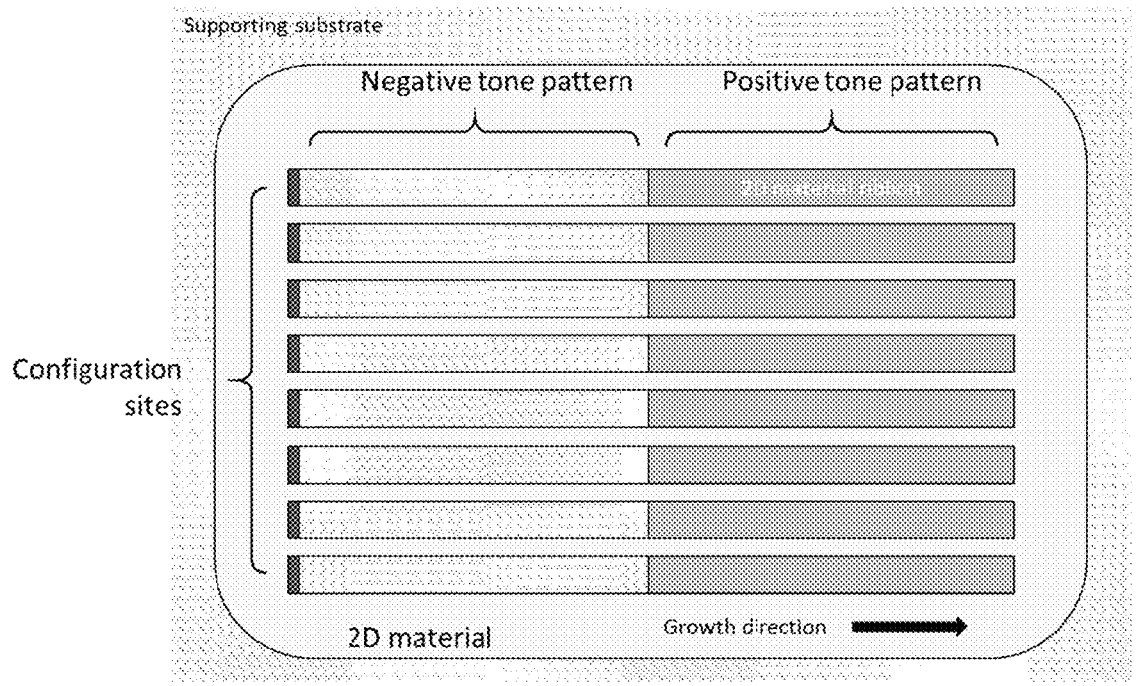
FIG. 14 is a schematic representation of a method that realizes lithographic patterning in a 2D material by parallel self-assembly.

FIG. 14 is a schematic representation of a method that realizes lithographic patterning in a 2D material by parallel self-assembly. By forming multiple configuration sites using, for example, the methods as described for FIGS. 6 to 9, self-assembly of multiple ribbons (indicated by the arrow labelled "growth direction") results in both negative and positive tone lithographic patterns. The negative tone patterns consist, in this instance, in an array of 8 2D-material strips left side-by-side on the supporting substrate. The positive tone pattern consists of the 8 ribbons lying on top of the host 2D material sheet as indicated. The structures may be used as lithography masks for wet (chemical) or dry (plasma) etching, conducting channels for electricity or heat, interconnects, or electrical semiconducting channels for diodes or transistors. The number of structures so formed could range from one to any number such that the entire sheet is patterned, and can range in size from nanometres to centimetres.

Figure 15:
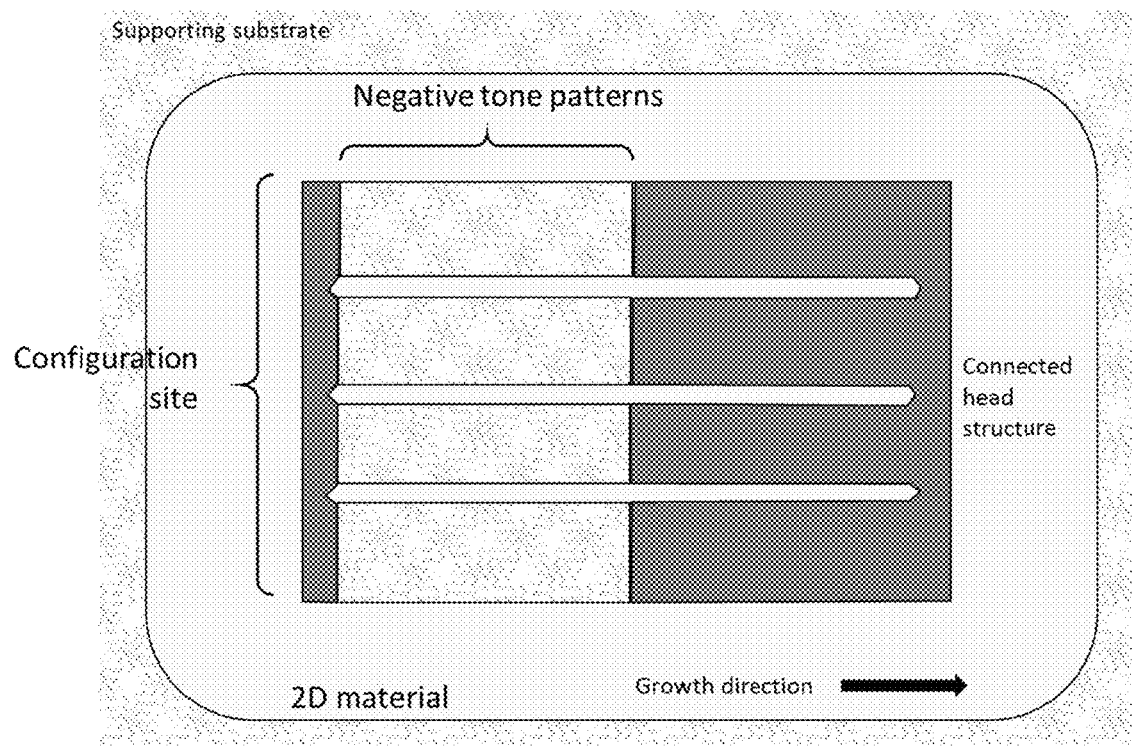
FIG. 15 is a schematic representation of a method that realizes parallel self-assembly of multiple ribbon structures in positive and negative tone via a single head structure (a head structure having a single indentation die with a plurality of initiation points). This structure allows the formation of very narrow (nanometers to 10's of nanometers) negative tone patterns of unpeeled 2D material, suitable for production of semiconducting ribbons.

The building blocks of the lithography are the following:
- Creation of single layer ribbons, tabs, or strips (single layer structures, SLS) that are attached to their host sheet both by a nanoscopic fold at one edge, and over their entire area by physical adhesion
- These SLS are generally defined by two torn edges along their length, and a leading fold and a trailing fold along their width. Alternatively the leading fold may be a tear.
- The width of the SLS is generally defined by the external nucleating process, while the length of the SLS is defined by the extent of self-assembly that occurs.
- The overall shape of the SLS is generally defined by the taper angle during growth of the length dimension, leading to inward, outward or null change to the width.
- Self-assembly growth never occurs such that the SLS moves onto exposed regions of the supporting substrate.
- The extent of self-assembly that defines the length is defined naturally by the adhesion, tearing resistance and available driving thermal energy. Or, it can be controlled artificially by placing a stopping barrier such as another self-assembled structure, foreign contaminant, or sheet edge.
- Multi-layer structures (MLS) can be created that consist of fully or partially stacked material that is attached in pleated or accordion-fashion to the layers above and below.
- Multiple SLS can be used to create negative-tone patterns left in the sheet, defined by torn edges and the attaching fold.
- For electronic or thermal devices, confinement of charge and heat can be by the torn edges and/or by the folded edges FIG. 15 is a schematic representation of a method that realizes parallel self-assembly of multiple ribbon structures in positive and negative tone via a single connected head structure. This structure allows the formation of very narrow (nanometres to 10's of nanometres) negative tone patterns of unpeeled 2D material, suitable for production of semiconducting ribbons.

Figure 16:
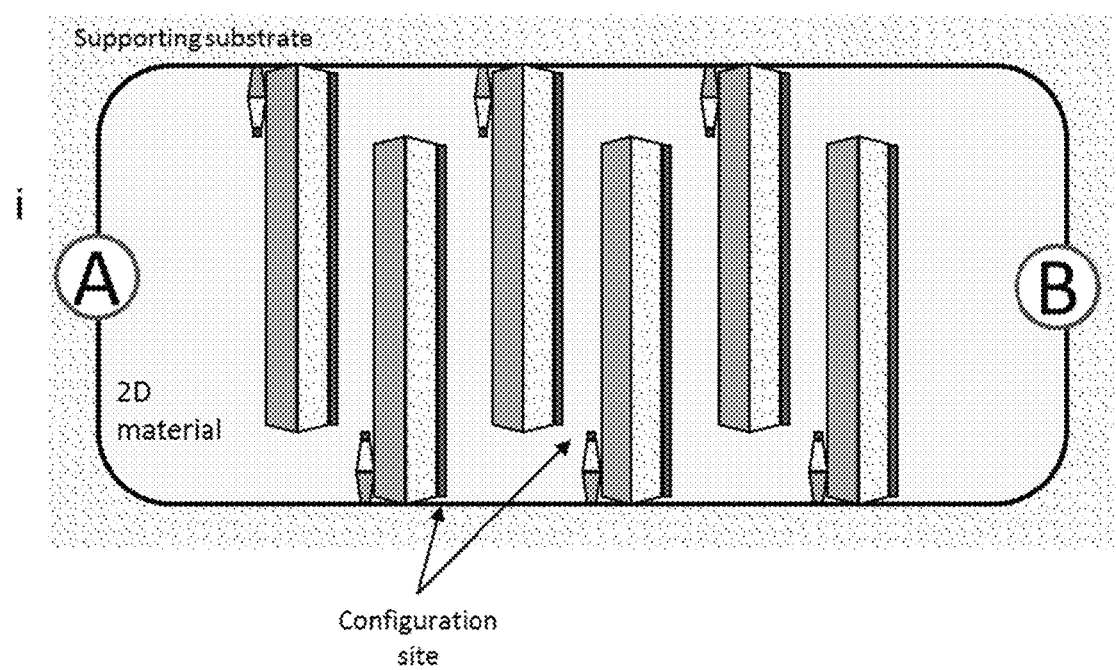
FIG. 16 is a schematic representation of the self-assembly of a serpentine path of 2D material by negative tone patterning.

FIG. 16 is a schematic representation of the self-assembly of a serpentine path of 2D material by negative tone patterning. An electrical or thermal conducting path between points A and B is established by an array of self-assembled structures prepared by parallel configuration of a repeated pattern consisting of a wide strip that is growth limited by a small secondary ribbon. The serpentine path of this structure is suitable for strain and resistance sensing, or as a heating element by resistive joule heating or direct heat transfer to the 2D material.

Figure 17:
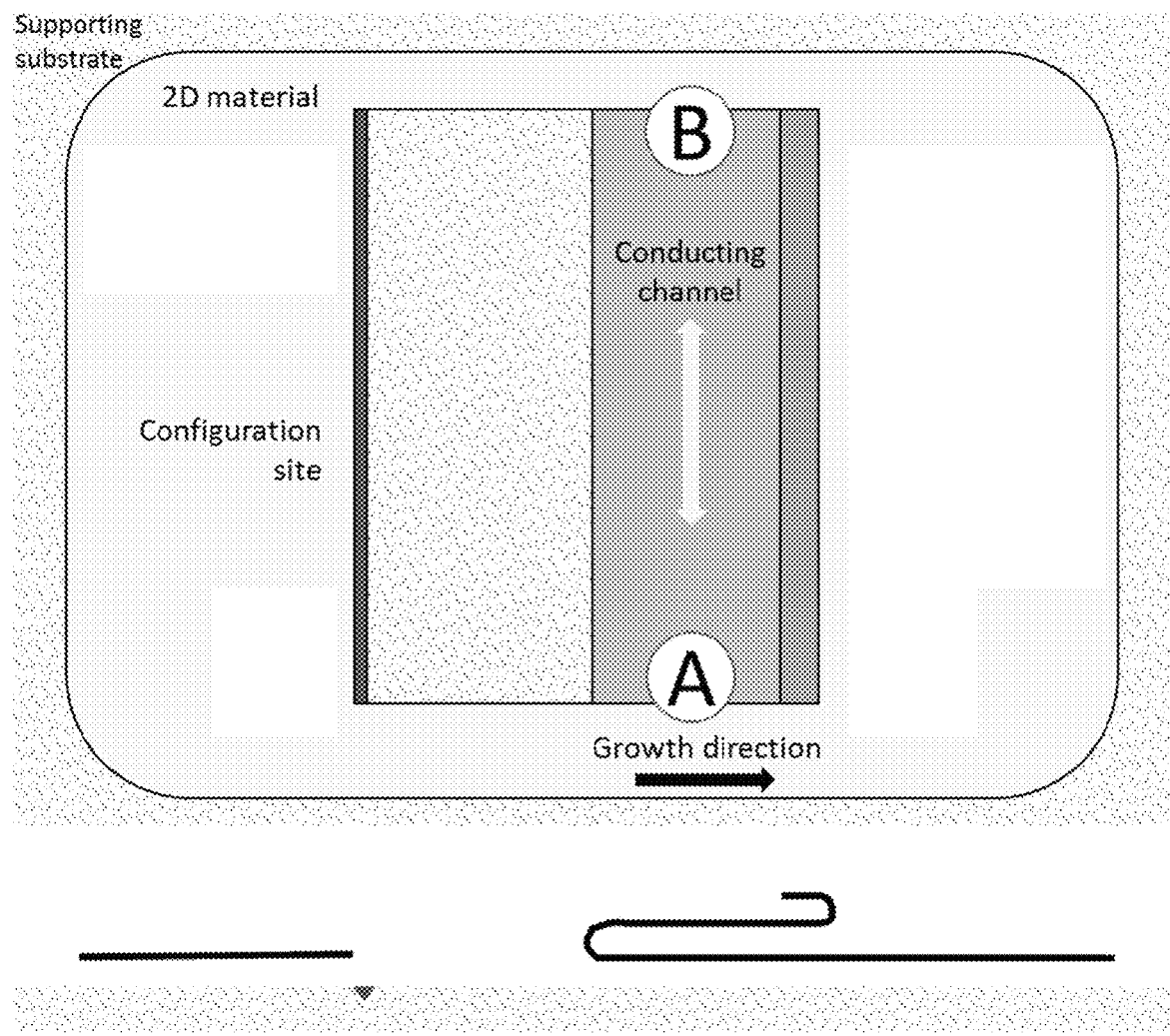
FIG. 17 is a schematic representation of a method that realizes an electrical or thermal channel defined by fold edges, not by tear edges. A ribbon self-assembled by any of the methods described previously is shown. A conducting channel is defined between the points A and B as indicated, with confinement of charge or heat by the folds as shown in cross-section.

FIG. 17 is a schematic representation of a method that realizes an electrical or thermal channel defined by fold edges, not by tear edges. A ribbon self-assembled by any of the methods described previously is shown. A conducting channel is defined between the points A and B as indicated, with confinement of charge or heat by the folds as shown in cross-section.

Figure 18:
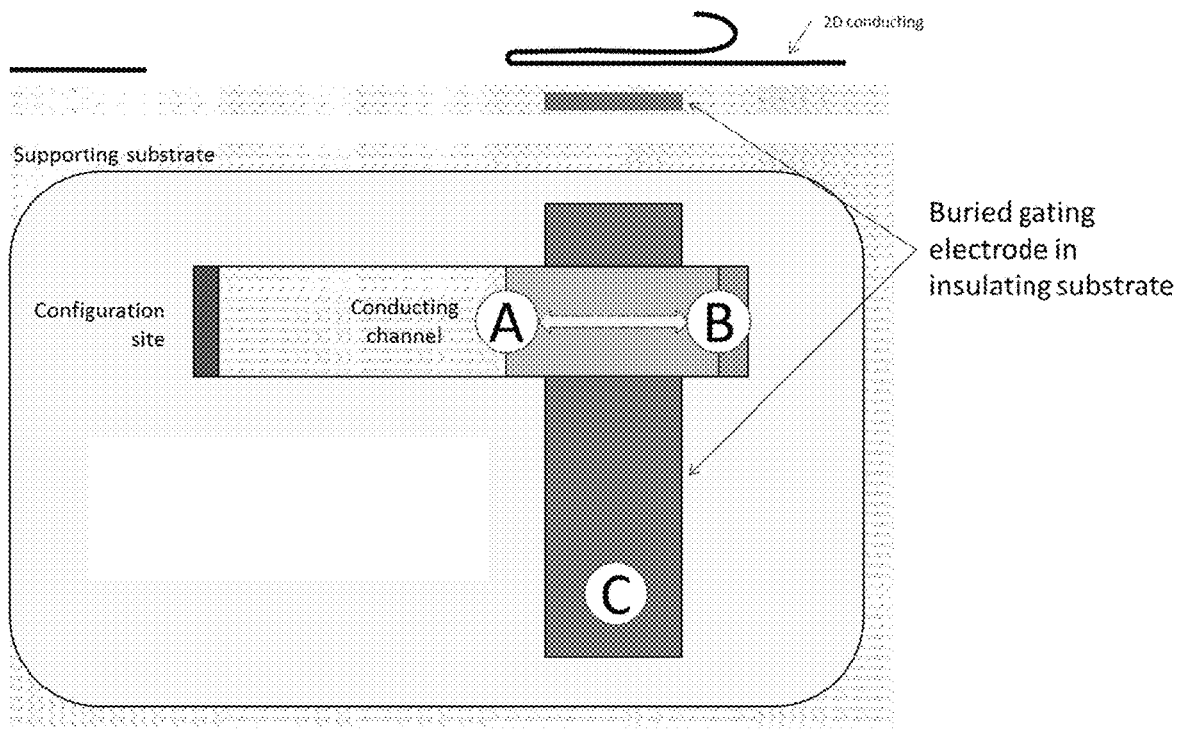
FIG. 18 is a schematic representation of a method that realizes a hybrid conventional-microelectronic and 2D material transistor by self-assembly of single ribbon near a sub-surface conducting gate.

FIG. 18 is a schematic representation of a method that realizes a hybrid conventional-microelectronic and 2D material transistor by self-assembly of single ribbon near a sub-surface conducting gate. A ribbon is nucleated on the left side, growing to the right such that it crosses a conducting channel buried below the surface of the insulating substrate as shown. An electrical channel is formed between A and B in the lower ribbon, with transduction regulated by the lower submerged channel. The conventional channel may be formed of any conducting material such as metal including, but not limited to, copper, gold, silver or aluminium, or a semiconductor, including, but not limited to, doped forms of silicon, germanium, gallium arsenide, silicon carbide, diamond, etc. using complementary metal oxide semiconductor (CMOS) or any other microelectronic processing method.

Figure 19:
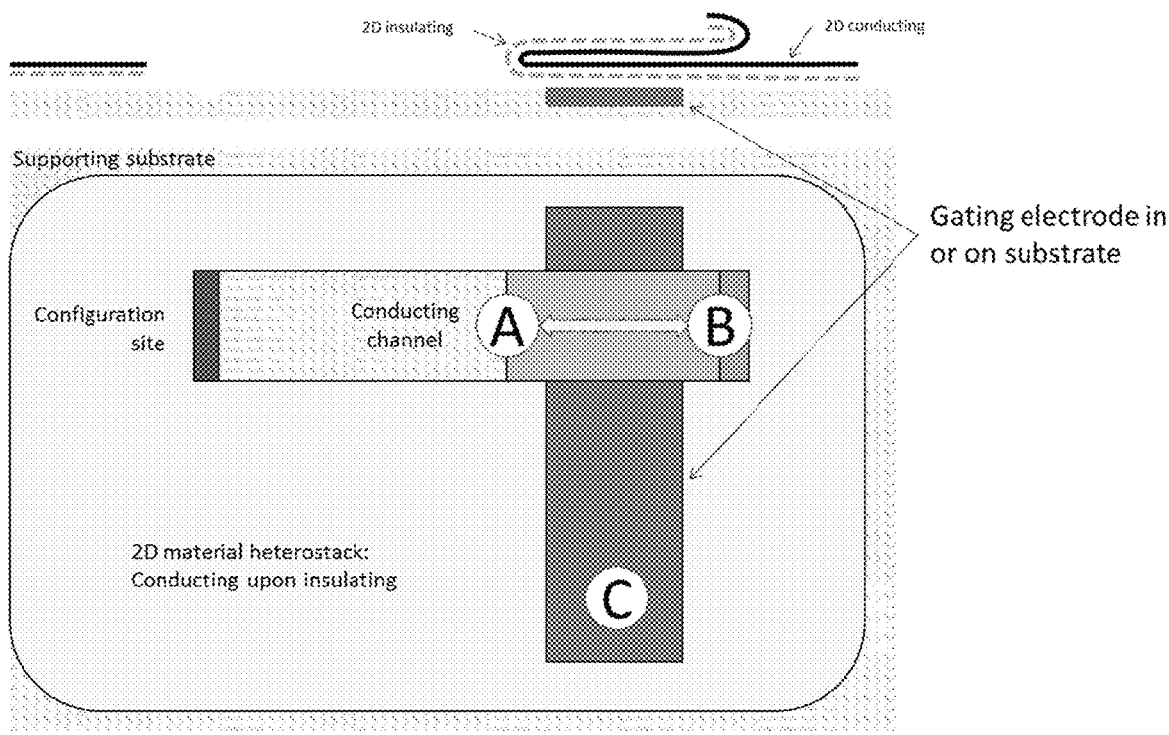
FIG. 19 is a schematic representation of a method that realizes a hybrid conventional-microelectronic and 2D material transistor by self-assembly of single heterostack ribbon near a sub-surface conducting gate.

FIG. 19 is a schematic representation of a method that realizes a hybrid conventional-microelectronic and 2D material transistor by self-assembly of single heterostack ribbon near a sub-surface conducting gate. A ribbon is nucleated in a heterostack consisting of a conducting 2D material layer placed on an insulating 2D material layer on the left side, growing to the right such that it crosses a conducting channel buried below the surface of the substrate as shown. An electrical channel is formed between A and B in the lower ribbon, with transduction regulated by the lower channel. The conventional channel may be formed of any conducting material such as metal, including but not limited to, copper, gold, silver or aluminium, or a semiconductor, including, but not limited to, doped forms of silicon, germanium, gallium arsenide, silicon carbide, diamond, etc. using CMOS or any other microelectronic processing method.

Figure 8:
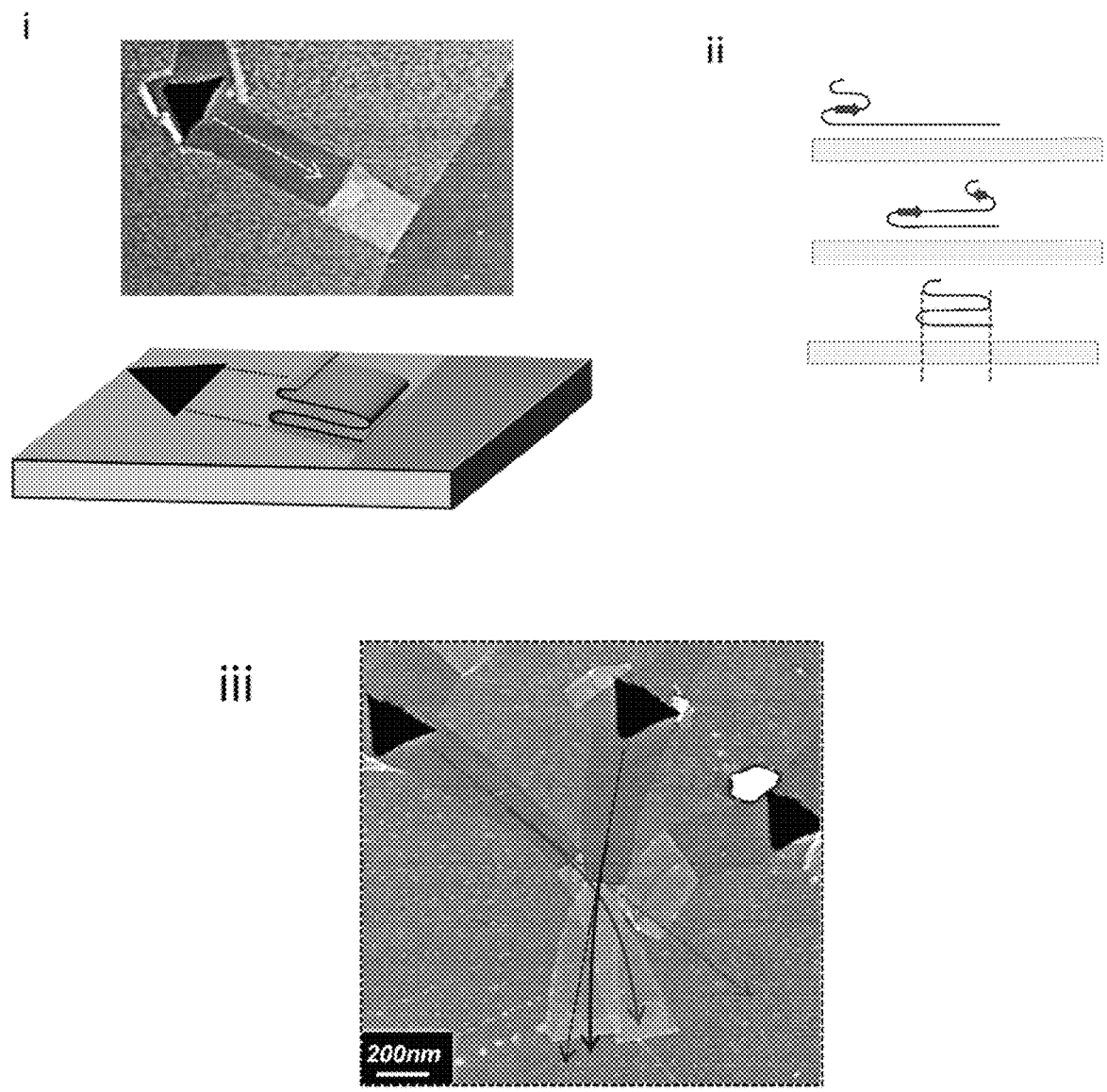
Figure 20:
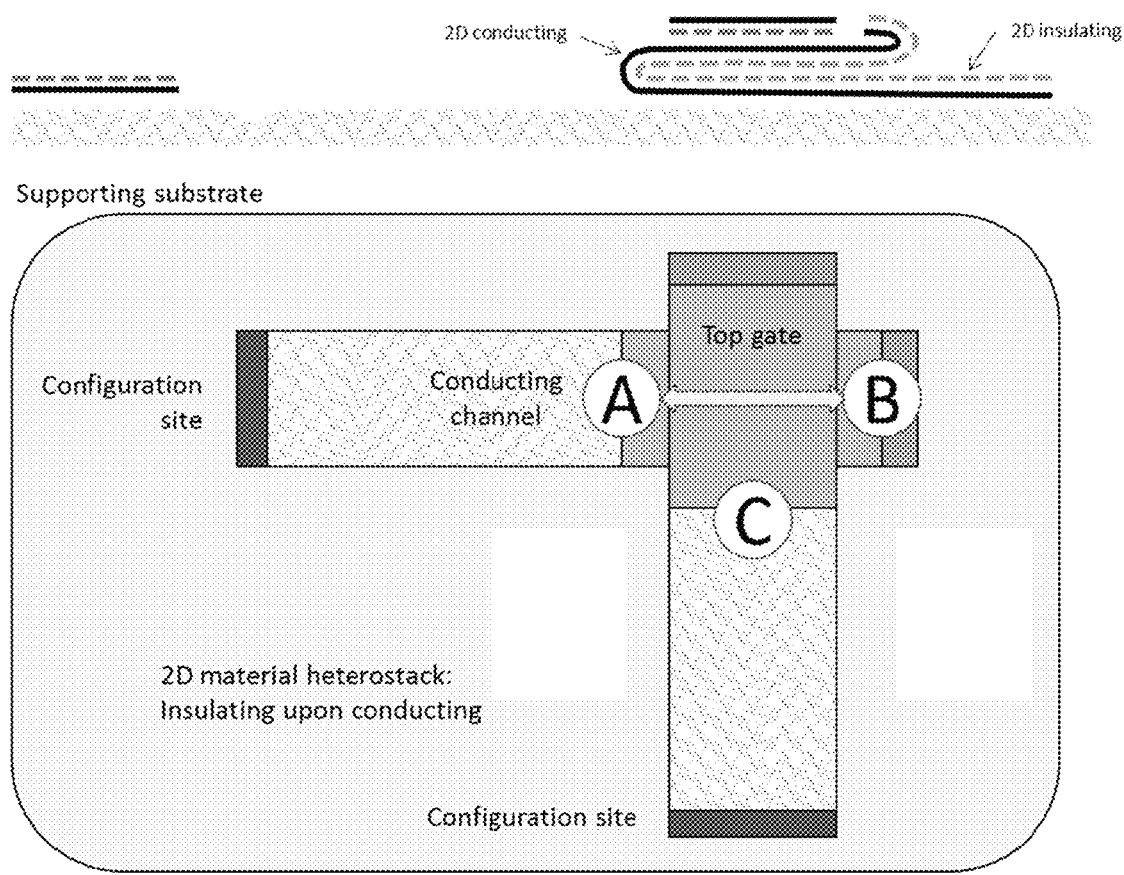
FIG. 20 is a schematic representation of a method that realizes an all-2D-material gated transistor by self-assembly of two ribbons in a topological heterostack consisting an insulating 2D material lying on top of a conducting 2D material FIG. 21(i)-21(iii) depict a schematic representation of a method that realizes a fuse-like device to cut-off the flow of electricity or heat.

FIG. 20 is a schematic representation of a method that realizes an all-2D-material gated transistor by self-assembly of two ribbons in a topological heterostack consisting an insulating 2D material lying on top of a conducting 2D material. A ribbon is nucleated on the left side, growing to the right. A second ribbon nucleated below it grows overtop the first as shown, as can happen as shown in FIG. 8(iii). A channel is formed between A and B in the lower ribbon, with transduction regulated by the upper gating ribbon contacted at C.

Figure 21:
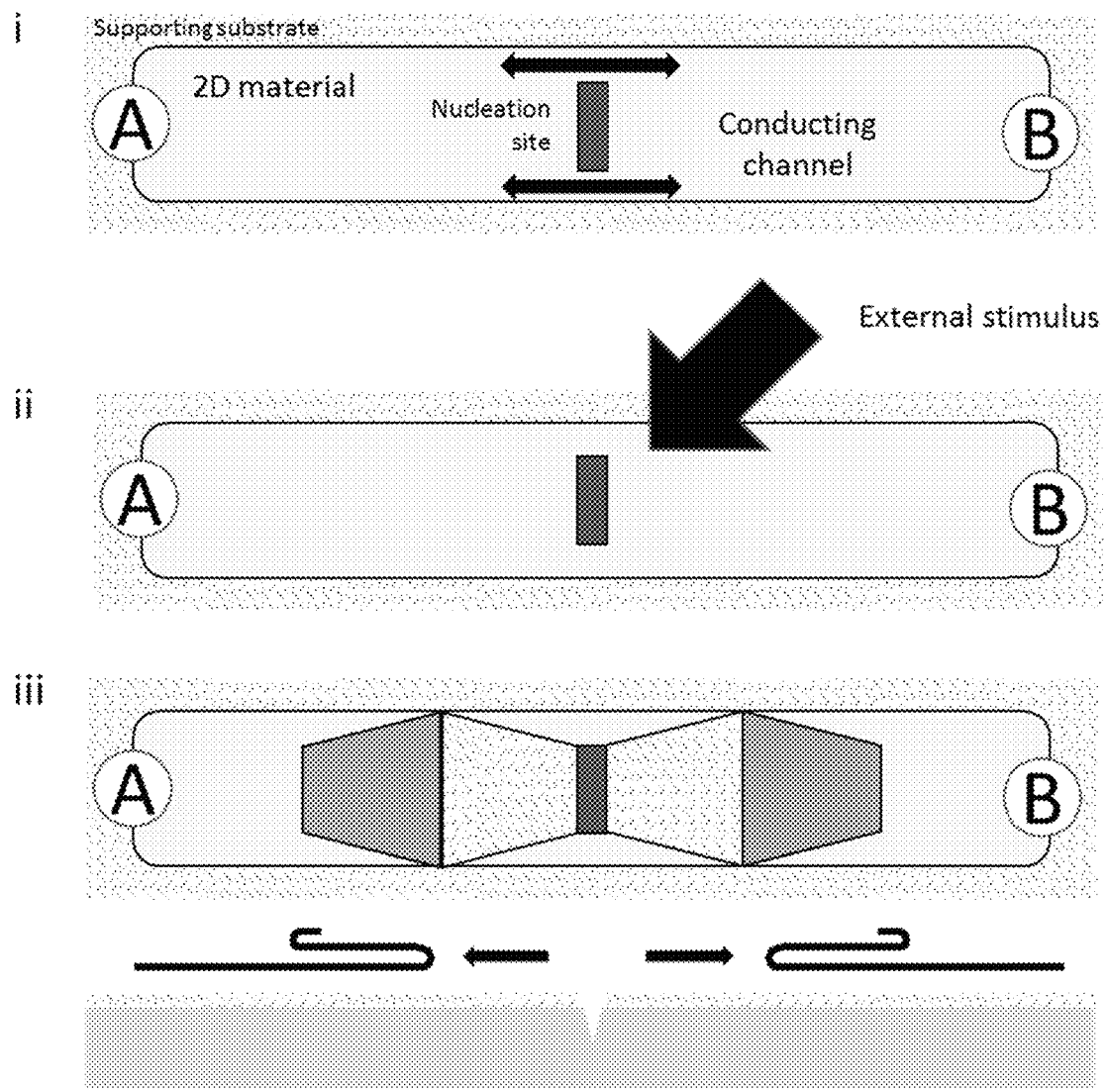

FIG. 21 is a schematic representation of a method that realizes a fuse-like device to cut-off the flow of electricity or heat. In (i), a 2D material supported on a substrate is configured with a self-assembly nucleation site as shown. The 2D material forms part of a closed conducting circuit from point A to B as shown. In (ii) an external stimulus is provided leading to an outward tapering self-assembly growth, as per FIG. 5(iv), of one or more ribbons (two are shown in (iii)) that effectively open the circuit and cutting the flow of electricity between A and B.

Figure 22:
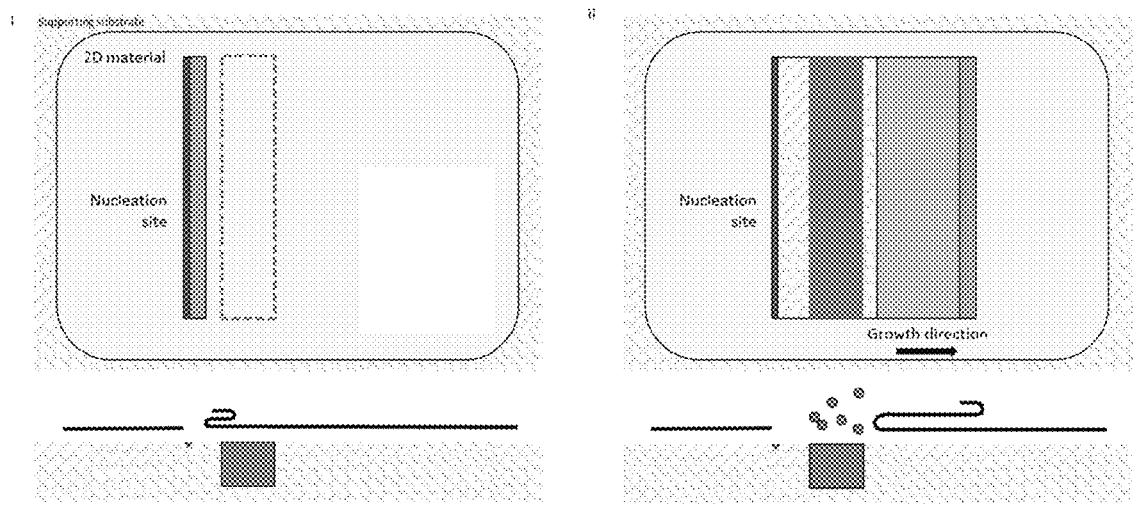

FIG. 22 is a schematic representation of a method that realizes a material-release type device. In (i), a 2D material supported on a substrate is configured with a self-assembly nucleation site in close proximity to a reservoir or channel of releasable material sealed by adhesion of the host 2D material sheet to the substrate. In (ii), following an external stimulus, self-assembly proceeds to expose the releasable material into the surrounding environment. The releasable material could be any one of a gas, liquid, particulate or powder, or dissolvable or sublimating solid. The surrounding environment could be any one of a vacuum, gas, or liquid. The external stimulus could be any influence that changes the available free energy and/or relative adhesion of the 2D material including changes in temperature, light, pH, gas composition, or liquid chemical composition. This method can be realized by configuration of arrays of self-assembly nucleation sites and reservoirs to allow parallel release sites of material.

Figure 23:
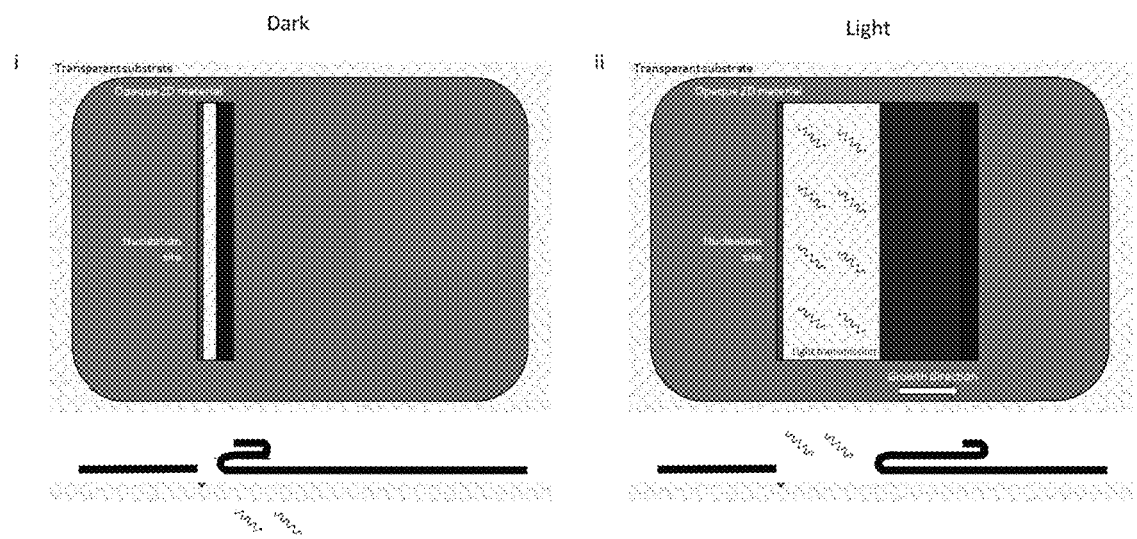

FIG. 23 is a schematic representation of a method that realizes actuation of a self-assembling ribbon to open a window for the passage of light or other electromagnetic radiation. In (i), an optically opaque 2D material supported on a transparent substrate is configured with a self-assembly nucleation site. In (ii), an external stimulus initiates self-assembly to open a window in the optically opaque 2D material to allow passage of light or other electromagnetic radiation. This method can be realized by configuration of arrays of self-assembly nucleation sites to allow parallel opening of windows that allows large area optical shutter opening.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

We claim:

1. A method for forming a self-assembled, self-contacting structure of 2D material on a support substrate, the method comprising the steps of:

depositing a layer of 2D material on the support substrate; and applying a force selected from a point force, a line force, or an areal force to a region of the 2D material such that the 2D material forms a self-contacting fold at that region wherein the self-contacting fold either:

(a) spontaneously self-assembles into the self-assembled, self-contacting structure without further stimulus, or (b) spontaneous self-assembles into the self-assembled, self-contacting structure after removing the force selected from a point force, line force, or areal force from the region of the 2D material, or (c) self-assembles into the self-assembled, self-contacting structure upon application of a further energy or stimulus to the self-contacting fold after removing the force selected from a point force, a line force, or an area force from the region of the 2D material structure.

2. The method of claim 1, further comprising the step of cutting, perforating or puncturing the layer of 2D material prior to applying the force selected from a point force, a line force, or an areal force to the layer of 2D material.

3. The method of claim 1, wherein the force selected from a point force, a line force, or an areal force being applied to the 2D material is selected from a mechanical force, a friction force, a sound or ultrasound wave, a temperature pulse or thermal force, an electrical force, a magnetic force, an electromagnetic pulse, or a radiation force due to an impingement of particles including atoms, molecules, ions, electrons and photons and beams thereof.

4. The method of claim 1, wherein the force selected from a point force, a line force, or an areal force being applied is a mechanical force, and wherein the mechanical force is applied by a tip of an indentation die or an imprint stamp contacting said layer of 2D material at the region.

5. The method of claim 4, wherein the indentation die or imprint stamp comprises several or many tips arranged in a specific pattern or layout to provide for a formation of an array of self-contacting folds.

6. The method of claim 5, wherein the array of self-contacting folds form a negative tone lithography structure consisting of patterns of 2D material left on the supporting substrate and not rearranged by self-assembly processes; or wherein the array of self-contacting folds form a positive tone lithography structure consisting of patterns of 2D material formed during rearrangement by self-assembly processes, or a combination thereof.

7. The method of claim 4, in which the indentation die or imprint stamp is a pre-patterned tool made from a hard substance or coating including diamond, polycrystalline diamond, diamond-like-carbon, glassy carbon, silicon carbide, silicon nitride, silicon, tungsten, tungsten carbide, sapphire, quartz, nickel, or other hard metals or ceramics.

8. The method according to claim 4, further comprising the step of applying an oscillating displacement of the tip of the indentation die or the imprint stamp with respect to the 2D material and surface of the support substrate.

9. The method according to claim 8, wherein the step of applying the displacement oscillation to the tip of the indentation die or the imprint stamp contacting said layer of 2D material and said surface of the support substrate is performed simultaneously with the step of applying a mechanical force to the tip of the indentation die or imprint stamp causing it to indent the surface of the support substrate and fret, fold, or wrinkle the 2D material sandwiched where the indentation die or the imprint stamp contact the layer of 2D material.

10. The method according to claim 9, wherein the mechanical force is applied by the tip of the indentation die or the imprint stamp, the tip contacting said layer of 2D material and said surface of the support substrate, and comprising an adhesive surface at its apex configured to initiate self-assembly of the self-contacting folds when the indentation die or imprint stamp is removed from contacting said layer of 2D material and said surface of the support substrate.

11. The method of any claim 1, further comprising a step of drawing the applied force selected from a point force, a line force, or an areal force across the surface of the 2D material to form a folded, self-contacting fold in said 2D material, which self-assembles either spontaneously or upon application of the further energy or stimulus to the self-contacting structure.

12. The method of claim 1, wherein the self-assembled, self-contacting structures are flaps, ribbons, or multi-folded and/or multi-stacked structures.

13. The method claim 1, wherein the method is performed within an environment selected from ambient air, one or more gases, a vacuum, water, liquid or other fluids.

14. The method of claim 1, wherein said 2D material layer is sourced from three-dimensional layered materials selected from the group comprising transition metal dichalcogenide having the formula $MX_n$, or any other layered material such as graphite, transition metal oxides, boron nitride (BN), $Bi_2Te_3$, $Sb_2Te_3$, TiNCl, or any other inorganic layered compound.

15. The method of claim 1, in which two or more identical or different layers of 2D material are deposited on the support substrate to form a uniform stack or heterostack of 2D material, which can self-assemble into the self-contacting structure.

16. A device comprising self-assembling, self-contacting structures of 2D material produced by the method according to claim 1.

17. The device according to claim 16, in which the device is selected from the group comprising electrodes, transparent electrodes, electronic wires, electronic interconnects, capacitors, inductors, transistors, memristors, electronic sensors, optoelectronic sensors, solar cells, light emitting diodes, thermoelectric devices, dielectrics, batteries, supercapacitors, nano-transistors, nano-capacitors, nano-light emitting diodes, nano-solar cells, fuses, alarms, chemical release systems, and optical shutters.

18. The method according to claim 1, wherein the energy is selected from global heating or local heating.

19. The method of claim 1, wherein the energy is selected from global heating by a hot plate or in a furnace, an oven, or rapid thermal anneal system; or by local heating from a laser, a heating element brought near to or integrated with the substrate, or a resistive heating element brought near to or integrated with the substrate.

20. The method according to claim 1, wherein the stimulus is selected from light, infrared light, ultra-violet light, x-rays, electromagnetic radiation, reactive gas environment, liquid chemical, pH change, pressure change, electric field, magnetic field, heat pulse, or force pulse.

* * * * *